United States Patent
Harris

(10) Patent No.: US 10,467,545 B2
(45) Date of Patent: Nov. 5, 2019

(54) SYSTEMS AND METHODS FOR CREATING AND USING HIGHER DEGREE INTERACTIONS BETWEEN QUANTUM DEVICES

(71) Applicant: D-Wave Systems Inc., Burnaby (CA)

(72) Inventor: Richard G. Harris, North Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 0 days.

(21) Appl. No.: 15/752,102

(22) PCT Filed: Aug. 11, 2016

(86) PCT No.: PCT/US2016/046611
§ 371 (c)(1),
(2) Date: Feb. 12, 2018

(87) PCT Pub. No.: WO2017/027733
PCT Pub. Date: Feb. 16, 2017

(65) Prior Publication Data
US 2018/0240034 A1    Aug. 23, 2018

Related U.S. Application Data

(60) Provisional application No. 62/204,820, filed on Aug. 13, 2015.

(51) Int. Cl.
*H01L 27/18* (2006.01)
*G06N 10/00* (2019.01)
(Continued)

(52) U.S. Cl.
CPC .............. *G06N 10/00* (2019.01); *B82Y 10/00* (2013.01); *H01F 38/14* (2013.01); *H01L 27/18* (2013.01);
(Continued)

(58) Field of Classification Search
CPC ...... G06N 10/00; G06N 99/002; B82Y 10/00; H01F 38/14; H01F 2038/143;
(Continued)

(56) References Cited

U.S. PATENT DOCUMENTS 7,135,701 B2    11/2006   Amin et al.
7,418,283 B2    8/2008    Amin
(Continued)

OTHER PUBLICATIONS

Bocko et al., "Prospects for Quantum Coherent Computation Using Superconducting Electronics," *IEEE Transactions on Applied Superconductivity* 7(2):3638-3641, 1997.
(Continued)

*Primary Examiner* — Shahed Ahmed
(74) *Attorney, Agent, or Firm* — Cozen O'Connor

(57) ABSTRACT

A higher degree of interactions between qubits is realizable. This disclosure generally relates to devices, and architectures for quantum instruments comprising quantum devices and techniques for operating the same. Systems and processors for creating and using higher degree interactions between qubits may be found herein. Higher order interactions include interactions among three or more qubits. Methods for creating and using higher degree interactions among three or more qubits on a quantum processor may be found herein.

27 Claims, 11 Drawing Sheets

(51) Int. Cl.
*B82Y 10/00* (2011.01)
*H01F 38/14* (2006.01)
*H03K 19/195* (2006.01)

(52) U.S. Cl.
CPC ..... *H03K 19/195* (2013.01); *H01F 2038/143* (2013.01)

(58) Field of Classification Search
CPC . H01L 27/18; H01L 39/223–226; H03K 3/38; H03K 17/92; H03K 19/195–1958; G06F 15/82; G06F 15/803; Y10S 977/933
See application file for complete search history.

(56) References Cited

U.S. PATENT DOCUMENTS

| | | | |
|---|---|---|---|
| 7,533,068 B2 | 5/2009 | Maassen van den Brink et al. | |
| 7,843,209 B2 | 11/2010 | Berkley | |
| 7,876,248 B2 | 1/2011 | Berkley et al. | |
| 8,008,942 B2 | 8/2011 | van den Brink et al. | |
| 8,018,244 B2 | 9/2011 | Berkley | |
| 8,022,722 B1 | 9/2011 | Pesetski et al. | |
| 8,035,540 B2 | 10/2011 | Berkley et al. | |
| 8,098,179 B2 | 1/2012 | Bunyk et al. | |
| 8,169,231 B2 | 5/2012 | Berkley | |
| 8,190,548 B2 | 5/2012 | Choi | |
| 8,195,596 B2 | 6/2012 | Rose et al. | |
| 8,421,053 B2 | 4/2013 | Bunyk et al. | |
| 8,536,566 B2 | 9/2013 | Johansson et al. | |
| 8,786,476 B2 | 7/2014 | Bunyk et al. | |
| 2004/0078421 A1* | 4/2004 | Routt ..................... B82Y 10/00 709/201 | |
| 2006/0225165 A1 | 10/2006 | Maassen van den Brink et al. | |
| 2010/0182039 A1 | 7/2010 | Baumgardner et al. | |
| 2011/0060780 A1* | 3/2011 | Berkley ................ B82Y 10/00 708/207 | |
| 2012/0278057 A1 | 11/2012 | Biamonte et al. | |
| 2015/0032991 A1 | 1/2015 | Lanting et al. | |
| 2016/0267032 A1* | 9/2016 | Rigetti .................... G06F 13/36 | |

OTHER PUBLICATIONS

Clarke et al., "Superconducting quantum bits," *Nature* 453:1031-1042, 2008.
Devoret et al., "Superconducting Qubits: A Short Review," Feb. 2, 2008, arXiv:cond-mat/0411174v1 [cond-mat.mes-hall] Nov. 7, 2004, 41 pages.
Devoret et al., "Superconducting Circuits for Quantum Information: An Outlook," *Science* 339:1169-1174, 2013.
Friedman et al., "Quantum superposition of distinct macroscopic states," *Nature* 406:43-46, 2000.
Harris et al., "Experimental Demonstration of a Robust and Scalable Flux Qubit," Sep. 24, 2009, arXiv:0909.4321v1 [cond-mat.supr-con] Sep. 24, 2009, 20 pages.
International Search Report, dated Nov. 14, 2016, for International Application No. PCT/US2016/046611, 6 pages.
Makhlin et al., "Quantum-state engineering with Josephson-junction devices," *Reviews of Modern Physics* 73:357-400, 2001.
Martinis, "Superconducting phase qubits," *Quantum Inf Process* 8:81-103, 2009.
Mooij et al., "Josephson Persistent-Current Qubit," *Science* 285:1036-1039, 1999.
Orlando et al., "Superconducting persistent-current qubit," *Physical Review B* 60(22): 15 398-15 413, 1999.
Written Opinion of the International Searching Authority, dated Nov. 14, 2016, for International Application No. PCT/US2016/046611, 8 pages.
Zagoskin et al., "Superconducting Qubits," *La Physique Au Canada* 63(4):215-227, 2007.

* cited by examiner

SYSTEMS AND METHODS FOR CREATING AND USING HIGHER DEGREE INTERACTIONS BETWEEN QUANTUM DEVICES

BACKGROUND

Field

This disclosure generally relates to devices, and architectures for quantum instruments comprising quantum devices and techniques for operating the same.

Quantum Devices

Quantum devices are structures in which quantum mechanical effects dominate. Quantum devices include circuits in which current transport is dominated by quantum mechanical effects. Such devices include spintronics, where electronic spin is used as a resource, and superconducting circuits. Both spin and superconductivity are quantum mechanical phenomena. Quantum devices can be used for measurement instruments, in computing machinery, and the like.

Quantum Computation

Quantum computation and quantum information processing are active areas of research and define classes of vendible products. A quantum computer is a system that makes direct use of at least one quantum-mechanical phenomenon, such as, superposition, tunneling, and entanglement, to perform operations on data. The elements of a quantum computer are not binary digits (bits) but typically are quantum binary digits or qubits. Quantum computers hold the promise of providing exponential speedup for certain classes of computation problems like simulating quantum physics. Useful speedup may exist for other classes of problems.

There are several types of quantum computers. An early proposal from Feynman in 1981 included creating artificial lattices of spins. More complicated proposals followed including a quantum circuit model, where logical gates are applied to qubits in a time ordered way. In 2000, a model of computing was introduced for solving satisfiability problems; based on the adiabatic theorem this model is called adiabatic quantum computing. This model is believed useful for solving hard optimization problems and potentially other problems. Further details on adiabatic quantum computing systems, methods, and apparatus are described in, for example, U.S. Pat. Nos. 7,135,701; and 7,418,283.

Quantum Annealing

Quantum annealing is a computation method that may be used to find a low-energy state, typically preferably the ground state, of a system. Similar in concept to classical simulated annealing, the method relies on the underlying principle that natural systems tend towards lower energy states because lower energy states are more stable. However, while classical annealing uses classical thermal fluctuations to guide a system to a low-energy state and ideally its global energy minimum, quantum annealing may use quantum effects, such as quantum tunneling, as a source of delocalization to reach a global energy minimum more accurately and/or more quickly than classical annealing. Thermal effects and other noise may be present in quantum annealing, hence the final low-energy state may not be the global energy minimum.

Adiabatic quantum computation may be considered a special case of quantum annealing for which the system, ideally, begins and remains in its ground state throughout an adiabatic evolution. Thus, quantum annealing systems and methods may generally be implemented on an adiabatic quantum computer. Throughout this specification and the appended claims, any reference to quantum annealing is intended to encompass adiabatic quantum computation unless the context requires otherwise.

Quantum annealing uses quantum mechanics as a source of delocalization, sometimes called disorder, during the annealing process. The computational problem is encoded in a Hamiltonian $H_P$, and the method introduces quantum effects by adding a delocalization Hamiltonian $H_D$ that does not commute with $H_P$. An example case is:

$$H_E \propto A(t)H_D + B(t)H_P \quad (1)$$

where $A(t)$ and $B(t)$ are time dependent envelope functions. For example, $A(t)$ changes from a large value to substantially zero during the evolution. The delocalization may be removed by removing $H_D$ (i.e., reducing $A(t)$). Quantum annealing is similar to adiabatic quantum computation in that the system starts with an initial Hamiltonian and evolves through an evolution Hamiltonian to a final "problem" Hamiltonian $H_P$ whose ground state encodes a solution, or approximate solution, to the problem. If the evolution is slow enough, the system may settle in the global minimum (i.e., the exact solution), or in a local minimum close in energy to the exact solution. The performance of the computation may be assessed via the residual energy (e.g., difference from exact solution using the objective function) versus evolution time. The computation time is the time required to generate a residual energy below some acceptable threshold value. In quantum annealing, $H_P$ may encode an optimization problem and therefore $H_P$ may be diagonal in the subspace of the qubits that encode the solution, but the system does not necessarily stay in the ground state at all times. The energy landscape of $H_P$ may be crafted so that its global minimum is the answer to the problem to be solved, and low-lying local minima are good approximations.

BRIEF SUMMARY

A quantum device may be summarized in at least one implementation as including three or more qubits and a coupler comprising a compound Josephson junction. The coupler is inductively coupled to each of the three or more qubits via a respective mutual inductance. The coupler is operable to provide a third-order interaction or a higher-order interaction among the three or more qubits.

A reversible logic gate may be summarized in at least one implementation as including three qubits each having a state. The state of the first qubit is representative of a first input to the reversible logic gate, and the state of the second qubit is representative of a second input to the reversible logic gate. The state of the third qubit is representative of an output from the reversible logic gate. The reversible logic gate further comprises a coupler comprising a compound Josephson junction. The coupler is inductively coupled to each of the first, the second and the third qubits via a respective mutual inductance. The coupler is operable to provide a second-order interaction between each pair of qubits selected from the first, the second and the third qubits, and a third-order interaction among the first, the second and the third qubits.

In some implementations, the reversible logic gate is a reversible exclusive OR (XOR) logic gate. In some implementations of the reversible XOR logic gate, a magnitude of the second-order interactions between each pair of qubits selected from the three qubits is essentially zero, and the magnitude of the third-order interaction among the three qubits is greater than zero. In some implementations of the reversible XOR logic gate, the magnitude of the second-order interactions between each pair of qubits selected from the three qubits is essentially zero (i.e., within a defined threshold of zero), and the magnitude of the third-order interaction among the three qubits is greater than zero (i.e., outside a defined threshold of zero).

In some implementations, the reversible logic gate is a reversible NOT AND (NAND) logic gate. In the reversible NAND logic gate, the magnitude of the second-order interaction between the first qubit and the third qubit is about the same as the magnitude of the second-order interaction between the second qubit and the third qubit, and the magnitude of the second-order interaction between the second qubit and the third qubit is about the same as the magnitude of the third-order interaction among the three qubits. Furthermore, the magnitude of the third-order interaction among the three qubits is about the same as the local bias on the third qubit, and the local bias on the third qubit is non-zero. Also, in the reversible NAND logic gate, the magnitude of the second-order interaction between the first qubit and the second qubit is about the same as the local bias on the first qubit, the local bias on the first qubit is about the same as the local bias on the second qubit, and the local bias on the second qubit is essentially zero.

A quantum processor can comprise any of the logic gates described above.

A quantum device can be summarized as including four qubits; a first coupler comprising a compound Josephson junction, the coupler inductively coupled to each of the four qubits by a respective mutual inductance and operable to provide a third-order magnetic susceptibility among the four qubits; and a second coupler comprising a compound Josephson junction, the coupler inductively coupled to each of the four qubits by a respective mutual inductance operable to provide a linear magnetic susceptibility among the four qubits. The first coupler is tunable to optimize, or at least enhance, the 4-local interaction among the four qubits, and the second coupler is tunable to null, or at least partially compensate, for the 2-local interactions between pairs of the four qubits.

A quantum device can be summarized as including n qubits where n is a number greater than 2; and a coupler comprising a compound Josephson junction, the coupler inductively coupled to each of the n qubits by a respective mutual inductance. The coupler is tunable to optimize, or at least enhance, a magnetic susceptibility of order (n−1) so as to provide an n-local interaction among the qubits.

A quantum device can be summarized as including n qubits where n is a number greater than 2; and a plurality of couplers, each coupler comprising a compound Josephson junction, and each coupler inductively coupled to each of the n qubits by a respective mutual inductance. The coupler is tunable to optimize, or at least enhance, at least one k-local interaction among one or more subsets of the n qubits, where 1≤k≤n.

A quantum device may be summarized as including three qubits and a coupler inductively coupled to each of the three qubits by a respective mutual inductance. The coupler may be operable to provide a third-order interaction or a higher-order interaction among the three qubits. The coupler may be inductively coupled to each of the three qubits by a respective mutual inductance, directly, and without an intervening coupler. The coupler may be the only coupler that is inductively coupleable to each of the three qubits.

The coupler may include a closed loop of material that superconducts at or below a critical temperature, the closed loop of material interrupted by a compound Josephson junction. The coupler may include three interface structures spaced along the closed loop of material, a respective one of the inductive interface structures for each of the three qubits. The three interface structures of the coupler may be positioned and operable to selective inductively couple with respective ones of the three qubits.

The quantum device may further include at least a fourth qubit. The closed loop of material of the coupler may have at least a fourth inductive interface structure positioned and operable to selectively inductively couple with the fourth qubit, and the coupler may be operable to provide a third-order interaction or a higher-order interaction among the four qubits. The coupler may be the only coupler that is directly inductively coupleable to the four qubits. The coupler may be operable to provide a third-order magnetic susceptibility among the four qubits.

The quantum device may further include a second coupler inductively coupled to each of the four qubits by a respective mutual inductance operable to provide a linear magnetic susceptibility among the four qubits. The first coupler may be tunable to at least one of optimize or enhance the 4-local interaction among the four qubits, and the second coupler may be tunable to null, or at least partially compensate, for the 2-local interactions between pairs of the four qubits.

The second coupler may include a closed loop of material that superconducts at or below a critical temperature, the closed loop of the second coupler interrupted by a compound Josephson junction, the closed loop of the second coupler having four inductive interface structures, the four inductive interface structures positioned and operable to selectively inductively couple with respective ones of the four qubits.

In some implementations, the first qubit has a state, the state of the first qubit representative of a first input to the quantum device; the second qubit has a state, the state of the second qubit representative of a second input to the quantum device; the third qubit has a state, the state of the third qubit representative of an output from the quantum device; and the first coupler is further operable to provide a second-order interaction between each pair of qubits selected from the first, the second and the third qubits.

In some implementations, the quantum device may include a quantum processor.

In some implementations, the quantum device may include a reversible logic gate. The reversible logic gate may include a reversible exclusive OR (XOR) logic gate wherein: an absolute value of a strength of a third-order interaction among the three qubits is non-zero; an absolute value of a strength of a second-order interaction between each pair of qubits selected from the three qubits is smaller than the absolute value of the strength of the third-order interaction among the three qubits by at least one order of magnitude; and absolute values of a strength of local bias on each of the three qubits is smaller than the absolute value of the strength of the third-order interaction among the three qubits by at least one order of magnitude. The reversible logic gate may include a reversible NOT AND (NAND) logic gate, wherein: an absolute value of the strength the third-order interaction among the three qubits is non-zero; an absolute difference between a strength of the third-order interaction among the three qubits and a strength of the second-order interaction between the first qubit and the third qubit is smaller than the absolute value of the strength the third-order interaction among the three qubits by at least one order of magnitude; an absolute difference between the strength of the third-order interaction among the three qubits and a strength of a second-order interaction between the second qubit and the third qubit is smaller than the absolute value of the strength of the third-order interaction among the three qubits by at least one order of magnitude; an absolute value of a strength of the second-order interaction between the first qubit and the second qubit is smaller than the absolute value of the strength of the third-order interaction among the three qubits by at least one order of magnitude; a respective absolute value of a strength of a local bias on each of the first qubit and the second qubit is smaller than the absolute value of the strength of the third-order interaction among the three qubits by at least one order of magnitude; and an absolute difference between the strength of the third-order interaction among the three qubits and a strength of a local bias on the third qubit is smaller than the absolute value of the strength of the third-order interaction among the three qubits by at least one order of magnitude.

In some implementations, the quantum device may include a reversible logic gate. The reversible logic gate may include a reversible exclusive OR (XOR) logic gate wherein: a magnitude of the second-order interaction between the first qubit and the third qubit is about the same as the magnitude of the second-order interaction between the second qubit and the third qubit; a magnitude of the second-order interaction between the second qubit and the third qubit is about the same as the magnitude of the third-order interaction among the three qubits; a magnitude of the third-order interaction among the three qubits is about the same as a local bias on the third qubit; the local bias on the third qubit is non-zero; a magnitude of the second-order interaction between the first qubit and the second qubit is about the same as a local bias on the first qubit; the local bias on the first qubit is about the same as a local bias on the second qubit; and the local bias on the second qubit is essentially zero.

In some implementations, the first qubit may be communicatively coupled to receive a first input to the quantum device and operable to represent the first input to the quantum device via a state of the first qubit; the second qubit may be communicatively coupled to receive a second input to the quantum device and operable to represent the second input to the quantum device via a state of the second qubit; the third qubit may be communicatively coupled to receive an output from the quantum device and operable to represent the output from the quantum device via a state of the third qubit; the first coupler may include a closed loop of material that superconducts at or below a critical temperature. The closed loop of the first coupler may have a first inductive interface structure, a second inductive interface structure and a third inductive interface structure. The first, the second, and the third inductive interface structures may be positioned and operable to selectively inductively couple with respective ones of the first, the second and the third qubits. The first coupler may further include a compound Josephson junction that interrupts the closed loop, and the first coupler may be further operable to provide a second-order interaction between each pair of qubits selected from the first, the second and the third qubits.

In some embodiments, the quantum device may include at least one superconducting qubit. The superconducting qubit may include a superconducting conducting flux qubit.

A quantum device may be summarized as including: a number n qubits where the number n is a number greater than 2; and a coupler inductively coupled to each of the number n qubits by a respective mutual inductance, wherein the coupler is tunable to at least one of optimize or enhance at least one of a magnetic susceptibility of order (n−1) so as to provide an n-local interaction among the qubits, or at least one k-local interaction among one or more subsets of the n qubits, where $1 \leq k \leq n$.

The coupler may include a closed loop of material that superconducts at or below a critical temperature. The closed loop of the coupler may have at least one inductive interface structure. The at least one inductive interface structure may be positioned and operable to selectively inductively couple with a respective at least one of the n qubits.

At least one of the n qubits may include a superconducting qubit. The superconducting qubit may include a superconducting flux qubit.

A quantum processor can comprise any of the logic gates described above.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, couplers, and control systems including microprocessors and drive circuitry have not been shown or described in detail to avoid unnecessarily obscuring descriptions of the embodiments of the present methods. Throughout this specification and the appended claims, the words "element" and "elements" are used to encompass, but are not limited to, all such structures, systems, and devices associated with quantum processors, as well as their related programmable parameters.

Unless the context requires otherwise, throughout the specification and claims which follow, the word "comprising" is synonymous with "including," and is inclusive or open-ended (i.e., does not exclude additional, unrecited elements or method acts), as are variations thereof, such as, "comprises" and "comprise."

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its non-exclusive sense, i.e., "and/or" unless the content clearly dictates otherwise.

The headings provided herein are for convenience only and do not interpret the scope or meaning of the embodiments.

Figure 1:
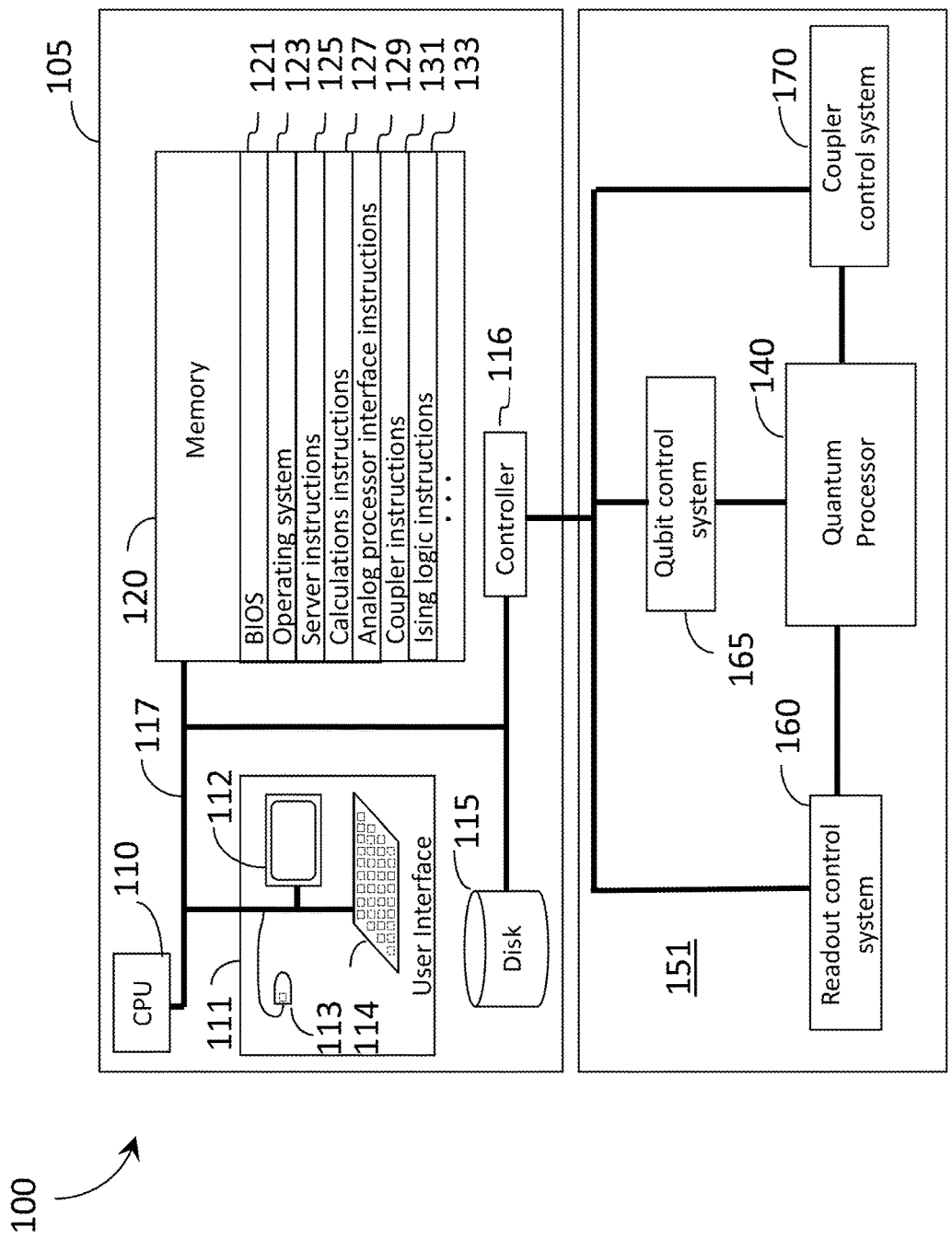
FIG. 1 is a schematic diagram that illustrates an exemplary hybrid computer including a digital processor and an analog processor in accordance with the present systems, devices, methods, and articles.

FIG. 1 illustrates a hybrid computing system 100 including a digital computer 105 coupled to an analog computer 151. In some implementations, the analog computer 151 is a quantum computer and the digital computer 105 is a classical computer. The exemplary digital computer 105 includes a digital processor (e.g., central processor unit 110) that may be used to perform classical digital processing tasks described in the present systems, devices, methods, and articles. Those skilled in the relevant art will appreciate that the present systems and methods can be practiced with other digital computer configurations, including hand-held devices, multiprocessor systems, microprocessor-based or programmable consumer electronics, personal computers ("PCs"), network PCs, mini-computers, mainframe computers, and the like, which when properly configured or programmed form special purpose machines, and/or maybe communicatively coupled to and control an analog computer, for instance a quantum computer.

Digital computer 105 will at times be referred to in the singular herein, but this is not intended to limit the application to a single digital computer. The present systems and methods can also be practiced in distributed computing environments (including cloud distributed environments), where tasks or sets of processor-readable instructions are performed or executed by remote processing devices, which are linked through a communications network. In a distributed computing environment, computer- or processor-readable instructions (sometimes known as program modules) may be located in both local and remote memory storage devices (e.g., memory 120, other non-volatile memory 115).

Digital computer 105 may include one or more digital processors 110, one or more nontransitory processor-readable media, for example system memory 120 and/or other non-volatile memory 115, and at least one system bus 117 that couples various system components, including system memory 120 to the processor 110.

Digital computer 105 may include a user input/output subsystem 111. In some implementations, the user input/output subsystem includes one or more user input/output components such as a display 112, mouse 113, and/or keyboard 114.

The digital processor 110 may take the form of any suitable logic processing unit, for example one or more central processing units ("CPUs"), graphics processing units ("GPUs"), digital signal processors ("DSPs"), application-specific integrated circuits ("ASICs"), programmable gate arrays ("FPGAs"), etc., which execute instructions or logic. Unless described otherwise, the construction and operation of the various blocks shown in FIG. 1 are of conventional design. As a result, such blocks need not be described in further detail herein, as they will be understood by those skilled in the relevant art.

System bus 117 can employ any known bus structures or architectures, including a memory bus with a memory controller, a peripheral bus, a local bus, power bus, instruction bus, data bus.

System memory 120 may include non-volatile memory, such as read-only memory ("ROM"), static random access memory ("SRAM"), Flash NAND; and volatile memory such as random access memory ("RAM") (not shown). A basic input/output system ("BIOS") 121, which can be stored in ROM, contains basic routines that help transfer information between elements within digital computer 105, such as during startup.

Digital computer 105 may also include other non-volatile memory 115. Non-volatile memory 115 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 115 may communicate with digital processor via system bus 117 and may include appropriate interfaces or controllers 116 coupled to system bus 117. Non-volatile memory 115 may serve as long-term storage for processor- or computer-readable instructions, data structures, or other data (sometimes called program modules) for digital computer 105.

Although digital computer 105 has been described as employing hard disks, optical disks and/or magnetic disks, those skilled in the relevant art will appreciate that other types of non-volatile computer-readable media may be employed, such a magnetic cassettes, flash memory cards, Flash, ROMs, smart cards, etc. Those skilled in the relevant art will appreciate that some computer architectures conflate volatile memory and non-volatile memory. For example, data in volatile memory can be cached to non-volatile memory. Or a solid-state disk that employs integrated circuits to provide non-volatile memory. Some computers place data traditionally stored on disk in memory. As well, some media that are traditionally regarded as volatile can have a non-volatile form, e.g., Non-Volatile Dual In-line Memory Module variation of Dual In Line Memory Modules.

Various processor- or computer-readable instructions, data structures, or other data can be stored in system memory 120. For example, system memory 120 may store an operating system 123, and a set of processor- or computer-readable server instructions 125. In some implementations, server instructions 125 includes instruction for communicating with remote clients and scheduling use of resources including resources on the digital computer 105 and analog computer 151. For example, a Web server application and/or Web client or browser application for permitting digital computer 105 to exchange data with sources via the Internet, corporate Intranets, or other networks, as well as with other server applications executing on server computers.

In some implementations, system memory 120 may store processor- or computer-readable calculation instructions (i.e., calculation instructions 127) to perform pre-processing, co-processing, and post-processing to analog computer 151. In accordance with the present systems and methods, system memory 120 may store at set of analog computer interface instructions 129 to interact with the analog computer 151.

In some implementations, system memory 120 stores coupler instructions 131 to augment the analog computer interface instructions 129. Some examples of the coupler instructions 131 allow the hybrid computer 100 to establish higher-degree interactions among three or more qubits, such as a greater than pairwise interaction among three or more qubits—for example, a 3-local interaction, a 4-local interaction, and the like, among a corresponding number of qubits. In some implementations, system memory 120 stores Ising logic instructions 133 to make use of interactions between qubits including greater than pairwise interaction among three or more qubits. In accordance with the present systems, devices, articles, and methods, Ising logic instructions 133 can include instructions to create and use logic gates from qubits coupled and configured to simulate an Ising Hamiltonian.

While shown in FIG. 1 as being stored in system memory 120, the modules shown and other data can also be stored elsewhere including in non-volatile memory 115.

Analog computer 151 can be provided in an isolated environment (not shown). For example, where analog computer 151 is a quantum computer, the environment shields the internal elements of the quantum computer from heat, magnetic field, and the like. Analog computer 151 includes an analog processor 140.

Figure 2A:
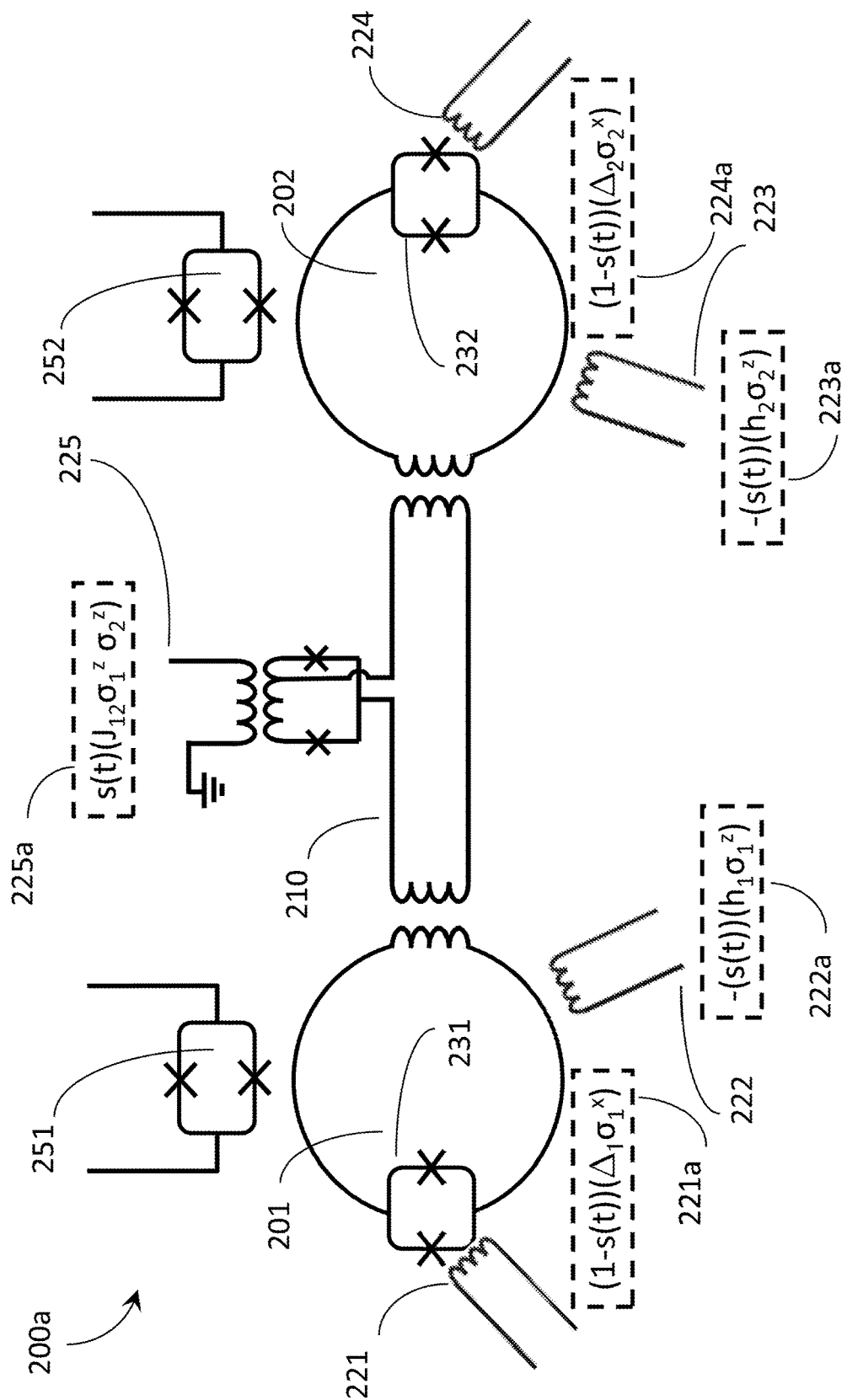
FIG. 2A is a schematic diagram that illustrates a portion of an exemplary superconducting quantum processor, an example of an analog processor for use in the hybrid computer of FIG. 1, in accordance with the present systems, devices, methods, and articles.

An example of analog processor 140 is a quantum processor, such as quantum processor 200a of FIG. 2A, which can include programmable elements such as qubits 201, 202, and couplers 210 of FIG. 2A, and other devices. The qubits are read via readout out system 160. These results are fed to sets of processor- or computer-readable instructions in digital computer 105 including server instructions 125, calculation instructions 127, analog computer interface instructions 129, or other instructions stored in system memory 120. The results can be returned over a network or the like.

The qubits are controlled via qubit control system 165. The couplers are controlled via coupler control system 170. In some embodiments, qubit control system 165 and coupler control system 170 are used to implement quantum annealing as described herein on analog processor 140.

In some implementations, digital computer 105 can operate in a networking environment using logical connections to at least one client computer system. In some implementations, digital computer 105 is coupled via logical connections to at least one database system, for example with data stored on non-volatile memory 115. These logical connections may be formed using any means of digital communication, for example, through a network, such as a local area network ("LAN") or a wide area network ("WAN") including, for example, the Internet.

The networking environment may include wired or wireless enterprise-wide computer networks, intranets, extranets, and/or the Internet. Other embodiments may include other types of communication networks such as telecommunications networks, cellular networks, paging networks, and other mobile networks. The information sent or received via the logical connections may or may not be encrypted. When used in a LAN networking environment, digital computer 105 may be connected to the LAN through an adapter or network interface card ("NIC") (communicatively linked to system bus 117). When used in a WAN networking environment, digital computer 105 may include an interface and modem (not shown), or a device such as NIC, for establishing communications over the WAN. Non-networked communications may additionally, or alternatively, be employed.

There are solid state qubits based on circuits of superconducting materials. There are two superconducting effects that underlie how superconducting qubits operate: magnetic flux quantization, and Josephson tunneling.

Flux is quantized because electrical charge carriers accrue a topological phase when passing around a conductive loop threaded by magnetic flux. For superconducting loops, the charge carriers are pairs of electrons called Cooper pairs. Quantum mechanics dictates that the Cooper pairs accrue a phase that is an integer multiple of $2\pi$. This then constrains the allowed flux in the loop. The flux is quantized. The current in the loop is governed by a single wavefunction and, for the wavefunction to be single-valued at any point in the loop, the flux within it is quantized.

Josephson tunneling is the process by which Cooper pairs cross an interruption, such as an insulating gap of a few nanometers, between two superconducting electrodes. The current crossing the interruption is dependent on the phase difference between the two populations of Cooper pairs in the electrodes.

Superconducting effects can be present in different configurations, and can give rise to different types of superconducting qubits including flux, phase, charge, and hybrid qubits. These different types of qubits depend on the topology of the loops, placement of the Josephson junctions, and the physical parameters of the parts of the circuits, such as, inductance, capacitance, and Josephson junction critical current.

A superconducting quantum processor may include a number of superconducting qubits and associated local bias devices, and a number of couplers (coupling devices) that provide communicative coupling between qubits. In one implementation, the superconducting qubit includes a superconducting loop interrupted by a Josephson junction. The ratio of the inductance of the Josephson junction to the geometric inductance of the superconducting loop can be expressed as $2\pi LI_c/\Phi_0$ (where L is the geometric inductance, $I_c$ is the critical current of the Josephson junction, and $\Phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

In accordance with some embodiments of the present systems, devices, articles, and methods, a quantum processor may be designed to perform quantum annealing and/or adiabatic quantum computation. An evolution Hamiltonian is proportional to the sum of a first term proportional to the problem Hamiltonian and a second term proportional to the delocalization Hamiltonian. A typical evolution may be represented by Equation (1), rewritten here as Equation (2):

$$H_E \propto A(t)H_D + B(t)H_P \quad (2)$$

where $H_P$ is the problem Hamiltonian, $H_D$ is the delocalization Hamiltonian, $H_E$ is the evolution or instantaneous Hamiltonian, and A(t) and B(t) are examples of evolution coefficients that control the evolution. In general, evolution coefficients vary between 0 and 1 inclusive. In some implementations, a time varying envelope function is placed on the problem Hamiltonian.

A common delocalization Hamiltonian is shown in Equation (3):

$$H_D \propto -\frac{1}{2}\sum_{i=1}^{N}\Delta_i\sigma_i^x \quad (3)$$

where N represents the number of qubits, $\sigma_i^x$ is the Pauli x-matrix for the $i^{th}$ qubit and $\Delta_i$ is the single qubit tunnel splitting induced in the $i^{th}$ qubit. Here, the $\sigma_i^x$ terms are examples of "off-diagonal" terms.

A common problem Hamiltonian includes first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N} h_i\sigma_i^z + \sum_{j>i}^{N} J_{ij}\sigma_i^z\sigma_j^z\right] \quad (4)$$

where N represents the number of qubits, is the Pauli z-matrix for the $i^{th}$ qubit, $h_i$ are dimensionless local fields for the qubits, $J_{i,j}$ are couplings between qubits, and $\varepsilon$ is a characteristic energy scale for $H_P$.

Here, $\sigma_i^z$ and $\sigma_i^z\sigma_j^z$ terms are examples of "diagonal" terms. The former is a single qubit term and the latter a two qubit term. Throughout this specification, the terms "problem Hamiltonian" and "final Hamiltonian" are used interchangeably. Hamiltonians such as $H_D$ and $H_P$ in Equations (3) and (4), respectively, may be physically realized in a variety of different ways. A particular example is realized by an implementation of superconducting qubits as described below.

FIG. 2A shows a portion of an exemplary superconducting quantum processor 200a designed for quantum annealing (and/or adiabatic quantum computing) where components may be used to implement the present systems and devices. As previously noted, the superconducting quantum processor 200a can be an implementation of analog processor 140 of FIG. 1.

The portion of superconducting quantum processor 200a shown in FIG. 2A includes two superconducting qubits 201 and 202. Quantum processor 200a also includes a coupler 210 that provides a tunable $\sigma_i^z\sigma_j^z$ coupling (diagonal coupling) between qubits 201 and 202. The diagonal coupling by coupler 210 provides 2-local interaction (i.e., pairwise interaction between qubits 201 and 202).

While the portion of quantum processor 200a shown in FIG. 2A includes only two qubits 201, 202 and one coupler 210, those of skill in the art will appreciate that quantum processor 200a may include any number of qubits and any number of couplers coupling information between the qubits.

The portion of quantum processor 200a shown in FIG. 2A may be implemented in order to physically realize quantum annealing and/or adiabatic quantum computing. Quantum processor 200a includes a plurality of interfaces 221-225 that are used to configure and control the state of quantum processor 200a. Each of interfaces 221-225 may be realized by a respective inductive coupling structure, as illustrated, as part of a programming subsystem and/or an evolution subsystem. Such a programming subsystem and/or evolution subsystem may be separate from quantum processor 200a, or it may be included locally (i.e., on-chip with quantum processor 200a) as described in, for example, U.S. Pat. Nos. 7,876,248 and 8,035,540.

In the operation of quantum processor 200a, interfaces 221 and 224 may each be used to couple a flux signal into a respective compound Josephson junction 231 and 232 of qubits 201 and 202, thereby realizing a tunable tunneling term (the $\Delta_i$ term) in the delocalization Hamiltonian. This coupling provides the off-diagonal $\sigma^x$ terms of the Hamiltonian described by Equation (3) and these flux signals are examples of "delocalization signals".

Similarly, interfaces 222 and 223 may each be used to apply a flux signal into a respective qubit loop of qubits 201 and 202, thereby realizing the $h_i$ terms, or local bias terms, in the problem Hamiltonian. This coupling provides the diagonal $\sigma^z$ terms of Equation (4). Furthermore, interface 225 may be used to couple a flux signal into coupler 210, thereby realizing the $J_{ij}$ terms in the problem Hamiltonian. This coupling provides the 2-local ($\sigma^z_i \sigma^z_j$) terms of Equation (4). As described herein, a hybrid computer can create, and make use of, a greater than 2-local diagonal coupling between three or more qubits, for example a 3-local interaction or a higher-order interaction.

In FIG. 2A, the contribution of each of interfaces 221-225 to the evolution Hamiltonian is indicated in boxes 221a-225a, respectively. As shown, in the example of FIG. 2A, the boxes 221a-225a are elements of a time-varying Hamiltonian for quantum annealing and/or adiabatic quantum computing.

Throughout this specification and the appended claims, the term "quantum processor" is used to generally describe a collection of physical qubits (e.g., qubits 201 and 202) and couplers (e.g., coupler 210). The physical qubits 201 and 202 and the coupler 210 are referred to as the "programmable elements" of the quantum processor 200a and their corresponding parameters (e.g., the qubit $h_i$ values and the coupler $J_{ij}$ values) are referred to as the "programmable parameters" of the quantum processor. In the context of a quantum processor, the term "programming subsystem" is used to generally describe the interfaces (e.g., "programming interfaces" 222, 223, and 225) used to apply the programmable parameters (e.g., the $h_i$ and $J_{ij}$ terms) to the programmable elements of the quantum processor 200a and other associated control circuitry and/or instructions.

As previously described, the programming interfaces of the programming subsystem may communicate with other subsystems which may be separate from the quantum processor or may be included locally on the processor. As described in more detail later, the programming subsystem may receive programming instructions in a machine language of the quantum processor and execute the programming instructions to program the programmable elements in accordance with the programming instructions. Similarly, in the context of a quantum processor, the term "evolution subsystem" generally includes the interfaces used to evolve the programmable elements of the quantum processor 200a and other associated control circuitry and/or instructions (e.g., "evolution interfaces" 221 and 224). For example, the evolution subsystem may include annealing signal lines and their corresponding interfaces (221, 224) to the qubits (201, 202).

Quantum processor 200a also includes readout devices 251 and 252, where readout device 251 is associated with qubit 201, and readout device 252 is associated with qubit 202. In some embodiments, such as shown in FIG. 2A, each of readout devices 251 and 252 includes a DC-SQUID inductively coupled to the corresponding qubit. In the context of quantum processor 200a, the term "readout subsystem" is used to generally describe the readout devices 251, 252 used to read out the final states of the qubits (e.g., qubits 201 and 202) in the quantum processor to produce a bit string. The readout subsystem may also include other elements, such as routing circuitry (e.g., latching elements, a shift register, or a multiplexer circuit) and/or may be arranged in alternative configurations (e.g., an XY-addressable array, an XYZ-addressable array, etc.). Qubit readout may also be performed using alternative circuits, such as that described in U.S. Pat. No. 8,854,074.

While FIG. 2A illustrates only two physical qubits 201, 202, one coupler 210, and two readout devices 251, 252, a quantum processor (e.g., processor 200a) may employ any number of qubits, couplers, and/or readout devices, including a larger number (e.g., hundreds, thousands, or more) of qubits, couplers and/or readout devices.

Examples of superconducting qubits include superconducting flux qubits, superconducting charge qubits, and the like. In a superconducting flux qubit, the Josephson energy dominates or is equal to the charging energy. In a charge qubit, it is the reverse. Examples of flux qubits that may be used include rf-SQUIDs, which include a superconducting loop interrupted by one Josephson junction, persistent current qubits, which include a superconducting loop interrupted by three Josephson junctions, and the like. See, examples of rf-SQUID qubits in Bocko, et al., 1997, *IEEE Trans. on Appl. Supercond.* 7, 3638; Friedman, et al., 2000, *Nature* 406, 43; and Harris et al., 2010, *Phys. Rev. B* 81, 134510; or persistent current qubits, Mooij et al., 1999, *Science* 285, 1036; and Orlando et al., 1999, *Phys. Rev. B* 60, 15398. In addition, hybrid charge-phase qubits, where the energies are equal, may also be used. Further details of superconducting qubits may be found in Makhlin, et al., 2001, *Rev. Mod. Phys.* 73, 357; Devoret et al., 2004, arXiv:cond-mat/0411174; Zagoskin and Blais, 2007, *Physics in Canada* 63, 215; Clarke and Wilhelm, 2008, *Nature* 453, 1031; Martinis, 2009, *Quantum Inf. Process.* 8, 81; and Devoret and Schoelkopf, 2013, *Science* 339, 1169. In some embodiments, the qubits and couplers are controlled by on-chip circuitry. Examples of on-chip control circuitry can be found in U.S. Pat. Nos. 7,876,248; 7,843,209; 8,018,244; 8,098,179; 8,169,231; and 8,786,476. Further details and implementations of exemplary quantum processors that may be used in conjunction with the present systems and devices are described in, for example, U.S. Pat. Nos. 7,533,068; 8,008,942; 8,195,596; 8,190,548; and 8,421,053.

Some quantum processors employ rf-SQUIDs as tunable inter-qubit couplers. In one embodiment, the couplers provide a second-order (2-local) interaction between pairs of qubits. However, it is possible to realize higher-order interactions with such devices.

The interaction of qubits and couplers is described by the interaction part of a Hamiltonian for n flux qubits attached to a common coupler via mutual inductances $M_{iC}$ ($1 \le i \le n$). This interaction can be written as:

$$\hat{H}_{int} \propto \frac{1}{2} \sum_{i=1}^{n} M_{iC} \hat{I}_i^p \hat{I}_{co}^p \qquad (5)$$

where $\hat{I}_i^p$ is the persistent current operator acting on qubit i and $\hat{I}_{co}^p$ is the persistent current operator acting on the coupler. Assuming small fluxes coupled into the coupler body, the coupler persistent current may be written as an expansion in terms of magnetic susceptibilities $\chi_j$ indexed by j. Magnetic susceptibility is the response of a device's persistent current, $I_P$, to applied external flux, $\Phi^x$. The magnetic susceptibility $\chi_j$ can be expressed as:

$$\chi_j = \frac{1}{j!} \frac{\partial^j I_P}{(\partial \Phi^x)^j}\bigg|_{\Phi^x=\Phi^{Op}} \quad (6)$$

where $\Phi^{Op}$ is an operating bias applied to the coupler.

At least one alternative definition of magnetic susceptibility of qubits exists and differs in sign from Equation (6). The coupler persistent current may be expressed as a summation over the product of the magnetic susceptibility and a set of terms accounting for the persistent current in the qubits and the inductive coupling of the qubits to the coupler. For example, $$\hat{I}_{co}^p = \sum_{j=1} \chi_j \left( \sum_{i=1}^n M_{iC} \hat{I}_i^p \right)^j \quad (7)$$

Figure 2B:
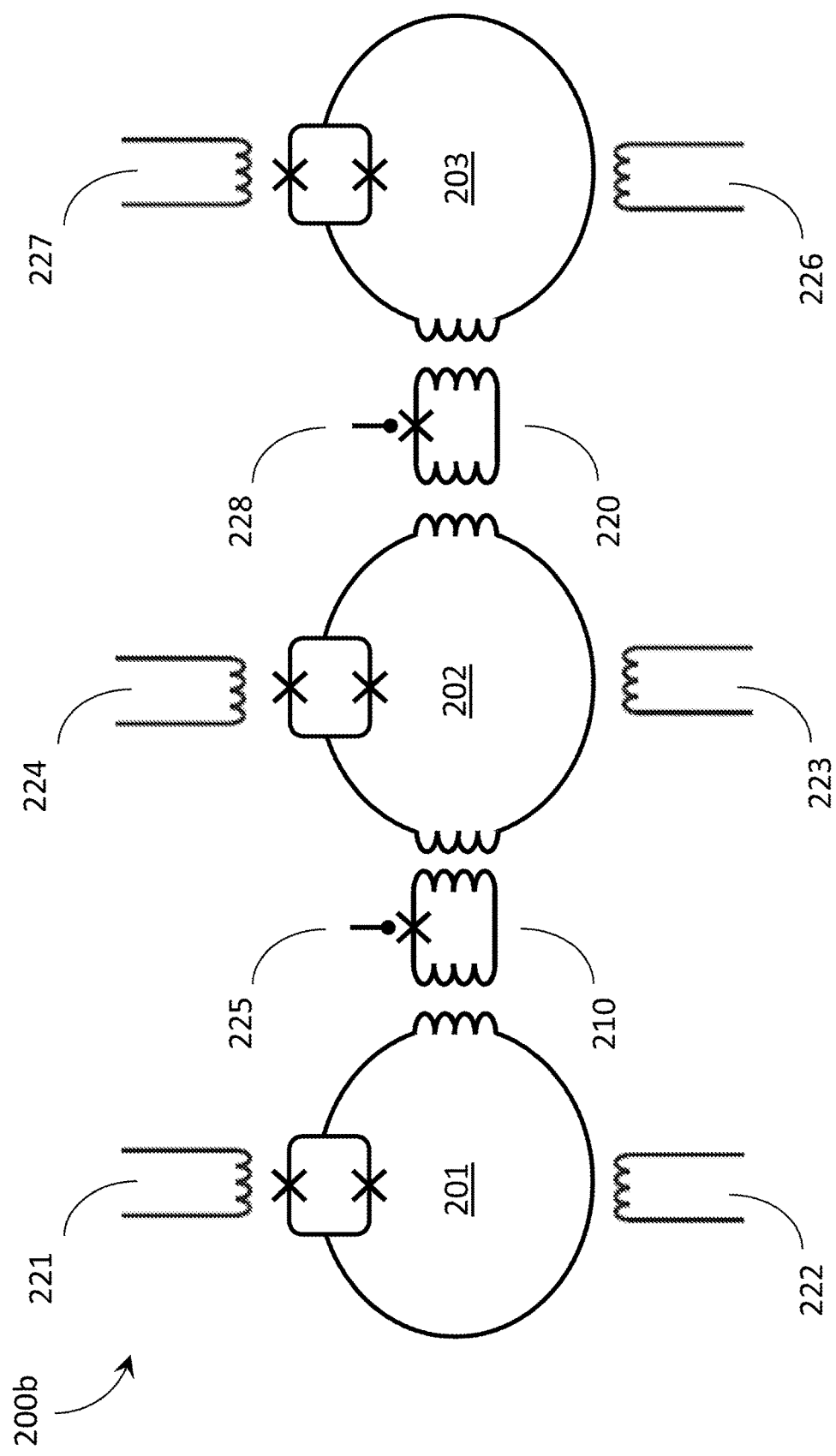
FIG. 2B is a schematic diagram that illustrates a portion of an exemplary superconducting quantum processor in accordance with the present systems, devices, methods, and articles.

FIG. 2B illustrates a portion 200b of an example of the analog processor 140 of FIG. 1 in the form of an exemplary superconducting quantum processor designed for quantum annealing and/or adiabatic quantum computing. Portion 200b includes three superconducting qubits 201, 202, and 203. Superconducting qubits 201 and 202 are described above in reference to FIG. 2A. Also shown is a pair of tunable couplers 210 and 220 between the superconducting qubits 201 and 202, and 202 and 203, respectively.

The portion 200b of quantum processor includes a plurality of interfaces 221-228, to configure and control the state of quantum processor. Interfaces 221, 224, and 227 couple a flux signal into a respective compound Josephson junction of qubits 201, 202, and 203, thereby realizing a set of off-diagonal terms in the system Hamiltonian. Similarly, interfaces 222, 223, and 226 apply a flux signal into a respective qubit loop of qubits 201, 202, and 203, thereby realizing a set of diagonal terms in the system Hamiltonian. Further, interfaces 225 and 228 couple a flux signal into couplers 210 and 220, thereby realizing a set of two qubit (pairwise) interaction terms. The interfaces 225 and 228 are given a compact representation in FIG. 2B, but may include the flux sources shown in FIG. 2A for example 225. The off-diagonal one qubit terms are $\Delta_i$ terms. The diagonal one qubit terms are $h_i$ terms. The two qubit diagonal terms are $J_{ij}$ terms. See U.S. patent application publication US 2015-0032991 A1 for further examples of intended mutual inductance between qubits.

Figure 3A:
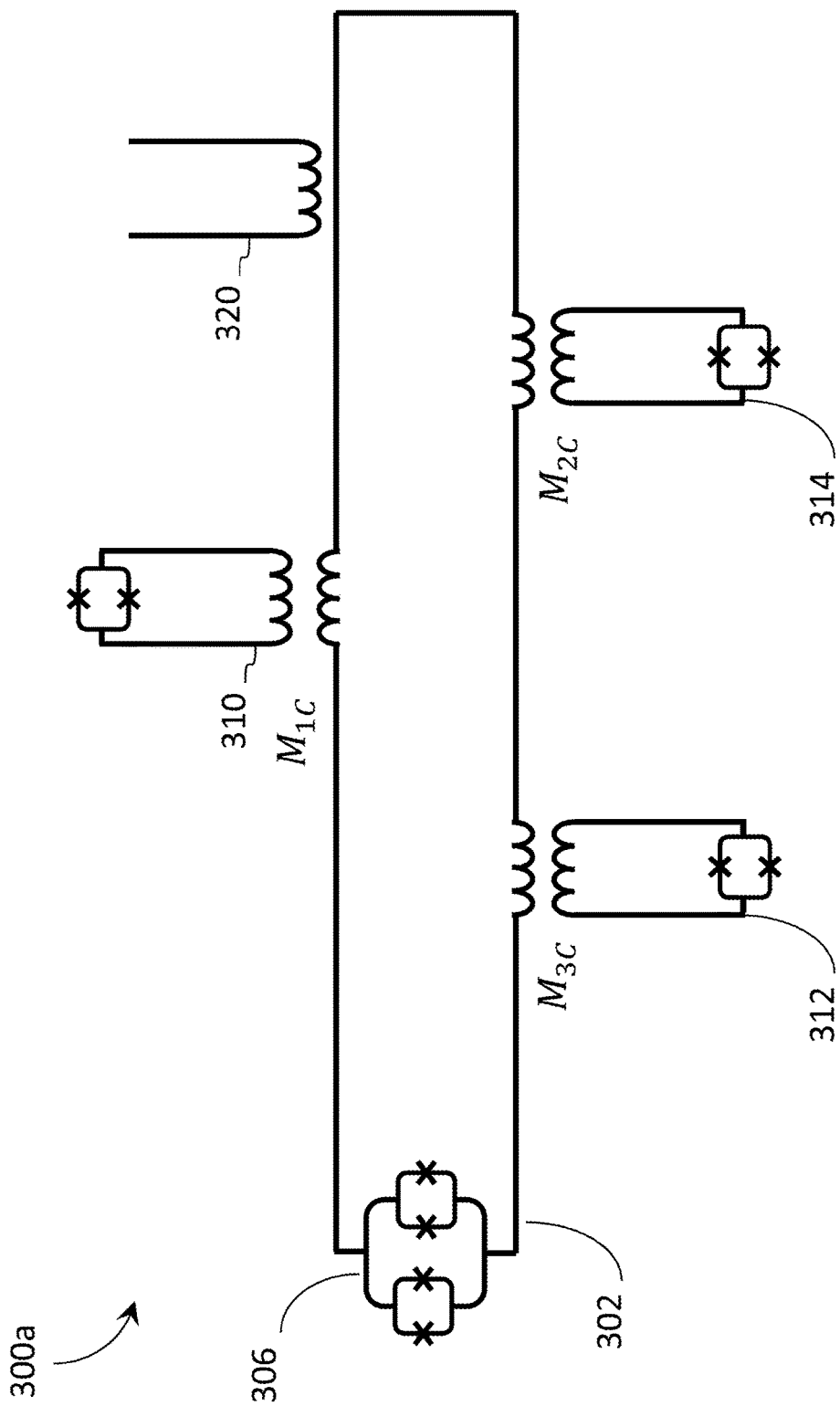
FIG. 3A is a schematic diagram that illustrates a portion of an exemplary superconducting quantum processor including a coupler inductively coupled to three qubits in accordance with the present systems, devices, methods, and articles.

FIG. 3A illustrates a portion of an exemplary superconducting quantum processor 300a including a coupler 302 inductively coupled to three qubits 310, 312, and 314. The coupler 302 and qubits 310, 312, and 314 each include a body that forms a loop. The bodies are made from one or more materials that are superconducting in a range of temperatures, current densities, and magnetic fields.

In the example implementation shown in FIG. 3A, the coupler includes a compound Josephson junction (CJJ) 306 as described in U.S. Pat. No. 8,536,566. CJJ 306 comprises a primary CJJ structure, the primary CJJ structure comprising a pair of parallel current paths, each of which is interrupted by a respective secondary CJJ structure. In some implementations, CJJ 306 comprises a single CJJ structure.

In some implementations, coupler 302 includes flux sources to effect changes in coupler parameters including critical current. Modulation of a flux in a compound Josephson junction is described above for at least interfaces 221 and 224 in FIG. 2A. Superconducting quantum processor 300a comprises an interface 320 operable to apply a flux bias to the body of coupler 302. Interface 320 is operable to apply flux to the coupler body, $\Phi_{body}^x$ as illustrated by horizontal axis 324 of FIG. 3B as described below.

The coupler 302 is inductively coupled to the qubit 310 by mutual inductive inductance $M_{1C}$ produced via a respective pair of inductors or inductive structures. The coupler 302 is inductively coupled to the qubit 314 via mutual inductive inductance $M_{2c}$ produced via a respective pair of inductors or inductive structures. The coupler 302 is inductively coupled to the qubit 312 via mutual inductive inductance $M_{3C}$ produced via a respective pair of inductors or inductive structures.

In an example embodiment of coupler 302, the inductance of the compound Josephson junction is much less than the inductance of the body loop. The choice of CJJ inductance is governed, at least in part, by the desired order of interaction. For example, a low CJJ inductance can provide $\chi_1$, a higher CJJ inductance can provide $\chi_j$, higher CJJ inductance still can provide $\chi_j$, and so on, for $\Phi_{body}=0$.

Figure 3B:
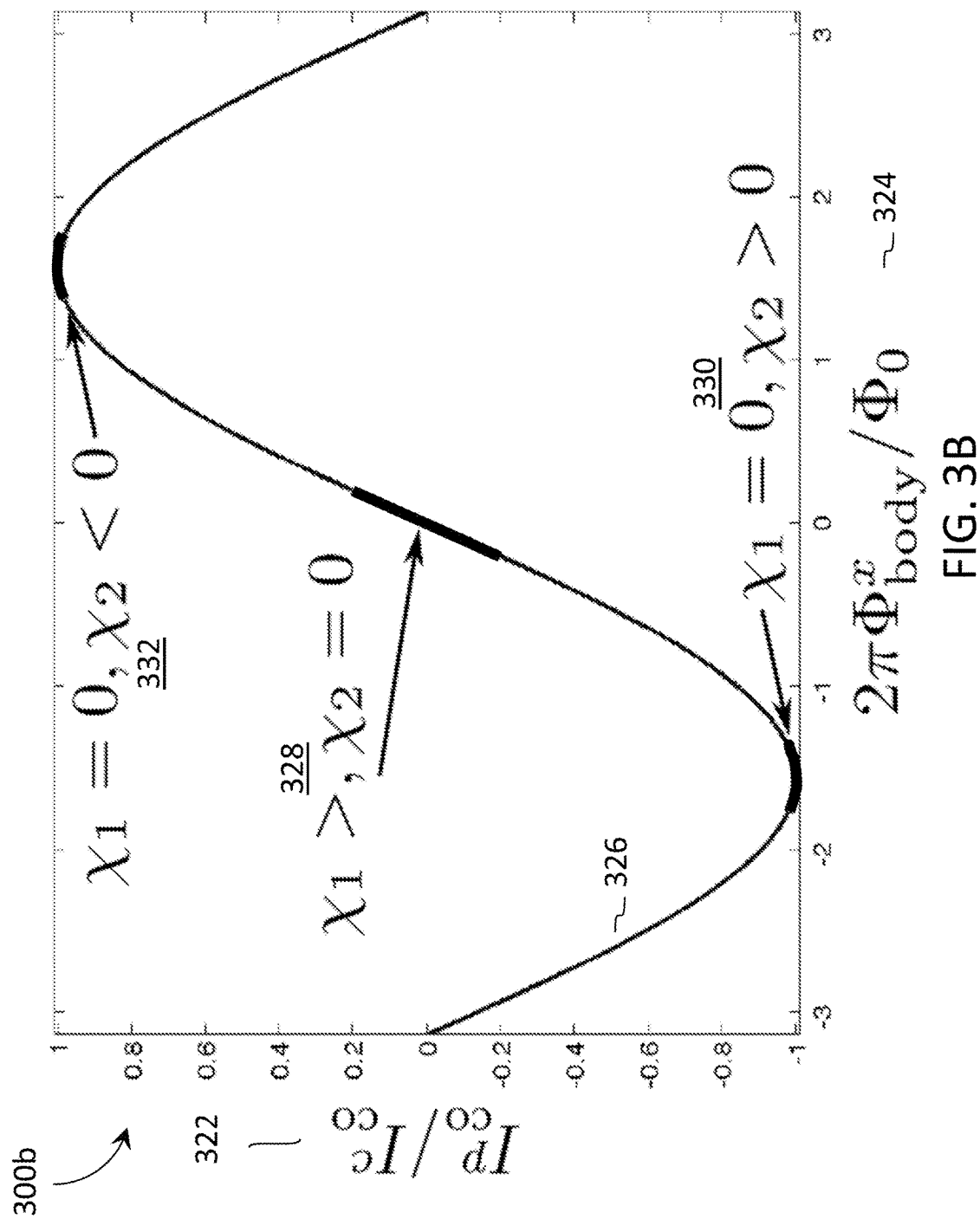
FIG. 3B is a graph that illustrates a calculation of persistent current in the coupler of FIG. 3A versus flux bias applied to a body loop of the coupler when the inductance of the compound Josephson junction of the coupler is much less than the inductance of the body loop of the coupler, in accordance with the present systems, devices, methods, and articles.

FIG. 3B shows a graph 300b of the calculated response of persistent current $\hat{I}_{co}^p$ within a superconducting coupler to applied flux to the coupler body, $\Phi_{body}^x$, such as within superconducting coupler 302 of FIG. 3A when the inductance of the compound Josephson junction is much less than the inductance of the body loop.

The graph 300b shows how the coupler behaves in certain regimes. In the graph 300b, the persistent current is plotted against applied external flux. The persistent current is measured in relation the coupler's critical current on vertical axis 322 and the applied flux on the horizontal axis 324. The horizontal axis has been scaled by a factor of $2\pi$ so it more closely resembles the familiar sine wave. The curve 326 shows the response of the coupler. The shape in the curve 326 admits a series of regimes and at least three of these are of interest to the teachings in this disclosure. For a first regime, 328, where the applied flux is about zero the response is approximately linear. In this case, the magnetic susceptibility can be safely regarded as zero for all but the first-order term, i.e., $\chi_1>0$, $\chi_2=0$, etc.

The regime 328 admits a second-order interaction between qubits inductively coupled to a common coupler. The persistent current in the coupler can be expressed as:

$$\hat{I}_{co}^p = \chi_1 \sum_{i=1}^n M_{iC} \hat{I}_i^p \quad (8)$$

This follows from the curve at regime 328 of graph 300b and the pairwise inductive coupling in FIG. 2B. Substituting Equation (8) into Equation (5) yields an interaction between a first qubit and a second qubit (e.g., qubits i and $$\hat{H}_{int}^{(1)} = \frac{1}{2} \sum_{j=1}^n \sum_{i=1}^n M_{iC} M_{jC} \chi_1 \hat{I}_i^p \hat{I}_j^p \quad (9)$$

The persistent current operator can be written in terms of persistent current magnitude and Pauli operators. One definition is: $\hat{I}_i^p \equiv |I_q^p| \hat{\sigma}_i^z$. This form can be inserted in to Equation (9) to yield a two qubit diagonal interaction.

$$\hat{H}_{int}^{(1)} = \frac{1}{2}\sum_{j>i}^{n}\sum_{i=1}^{n} M_{iC}M_{jC}\chi_1 |I_p^2|^2 \hat{\sigma}_i^z \hat{\sigma}_j^z \quad (10)$$

The portion of the summation prior to the Pauli operator can be defined as the coupling value. Herein the coupling value for a coupling between qubits i and j is $J_{ij}$.

For a second regime 330 and a third regime 332, where the applied flux is about a quarter flux quantum in either direction, the response of the coupler is non-linear. In these cases, the magnetic susceptibility has a quadratic-like response. Near these regimes the coupler response can be characterized by a second-order magnetic susceptibility $\chi_2$. That is $\chi_1=0$, $|\chi_2|>0$, $\chi_3=0$ etc.

By expanding Equation (8) to second-order and substituting into Equation (5), a 3-local interaction term can be created. The persistent current in the coupler can be expressed to second-order as:

$$\hat{I}_{co}^p \approx \chi_1 \sum_{i=1}^{n} M_{iC}\hat{I}_i^p + \chi_2 \left(\sum_{i=1}^{n} M_{iC}\hat{I}_i^p\right)^2 \quad (11)$$

$$\hat{I}_{co}^p \approx \chi_1 \sum_{i=1}^{n} M_{iC}\hat{I}_i^p + \chi_2 \sum_{i=1}^{n} \left(M_{iC}\hat{I}_i^p\right)^2 + 2\chi_2 \sum_{j>i}^{n}\sum_{i=1}^{n} M_{iC}M_{jC}\hat{I}_i^p\hat{I}_j^p \quad (12)$$

Substituting the persistent current operator as defined in terms of persistent current magnitude and Pauli operators, $\hat{I}_i^p = |I_2^p|\hat{\sigma}_i^z$, and collecting terms of like degree an interaction Hamiltonian including a 3-local term can be defined.

$$\hat{H}_{int}^{(2)} = \frac{1}{2}\sum_{i=1}^{n} \varepsilon_i \hat{\sigma}_i^z + \sum_{j>i}^{n}\sum_{i=1}^{n} J_{ij}\hat{\sigma}_i^z\hat{\sigma}_j^z + 3\sum_{k>j}^{n}\sum_{j>i}^{n}\sum_{i=1}^{n} J_{ijk}\hat{\sigma}_i^z\hat{\sigma}_j^z\hat{\sigma}_k^z \quad (13)$$

Thus, expanding the susceptibility up to the second-order results in single qubit biases, second-order interactions between pairs of qubits (2-local), and third-order interactions among triplets of qubits (3-local). The latter is a new type of interaction that is currently not being used in quantum information processors. In principle, any or all the 2- and 3-local terms can be independently varied.

Figure 4A:
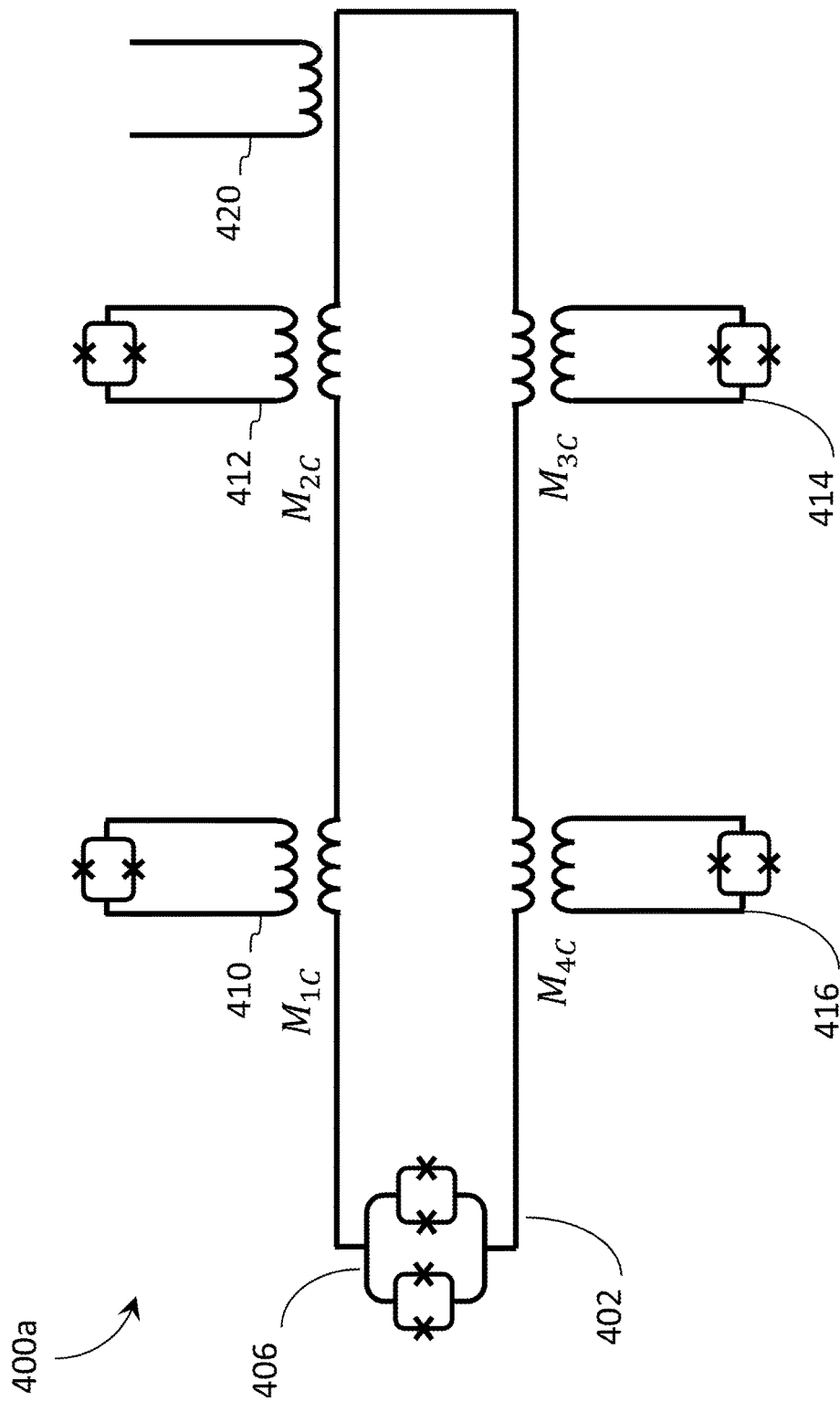
FIG. 4A is a schematic diagram that illustrates a portion of an exemplary superconducting quantum processor including a coupler inductively coupled to four qubits in accordance with the present systems, devices, methods, and articles.

FIG. 4A illustrates a portion of an exemplary superconducting quantum processor 400a including a coupler 402 inductively coupled to four qubits 410, 412, 414, and 416. The coupler 402 and qubits 410, 412, 414, and 416 each include a body that forms a loop. The bodies are made from one or more materials that are superconducting in a range of temperatures, current densities, and magnetic fields.

In the example shown in FIG. 4A, the coupler includes a compound Josephson junction 406 as described in U.S. Pat. No. 8,536,566 (see above description of CJJ 306). In some implementations, the coupler includes a single CJJ structure.

In some implementations, the coupler 402 includes flux sources to effect changes in coupler parameters including critical current. Modulation of a flux in a compound Josephson junction is described above for at least interfaces 221 and 224 in FIG. 2A. Superconducting quantum processor 400a comprises an interface 420 operable to apply a flux bias to the body of coupler 402. Interface 420 is operable to apply flux to the coupler body, $\Phi_{body}^x$ as illustrated by horizontal axis 424 of FIG. 4B as described below.

The coupler 402 is inductively coupled to qubits 410, 412, 414, and 416 by mutual inductive inductances $M_{1C}$, $M_{2C}$, $M_{3C}$, and $M_{4C}$, respectively.

In an example embodiment of coupler 402, the inductance of the compound Josephson junction is comparable to the inductance of the body loop.

Figure 4B:
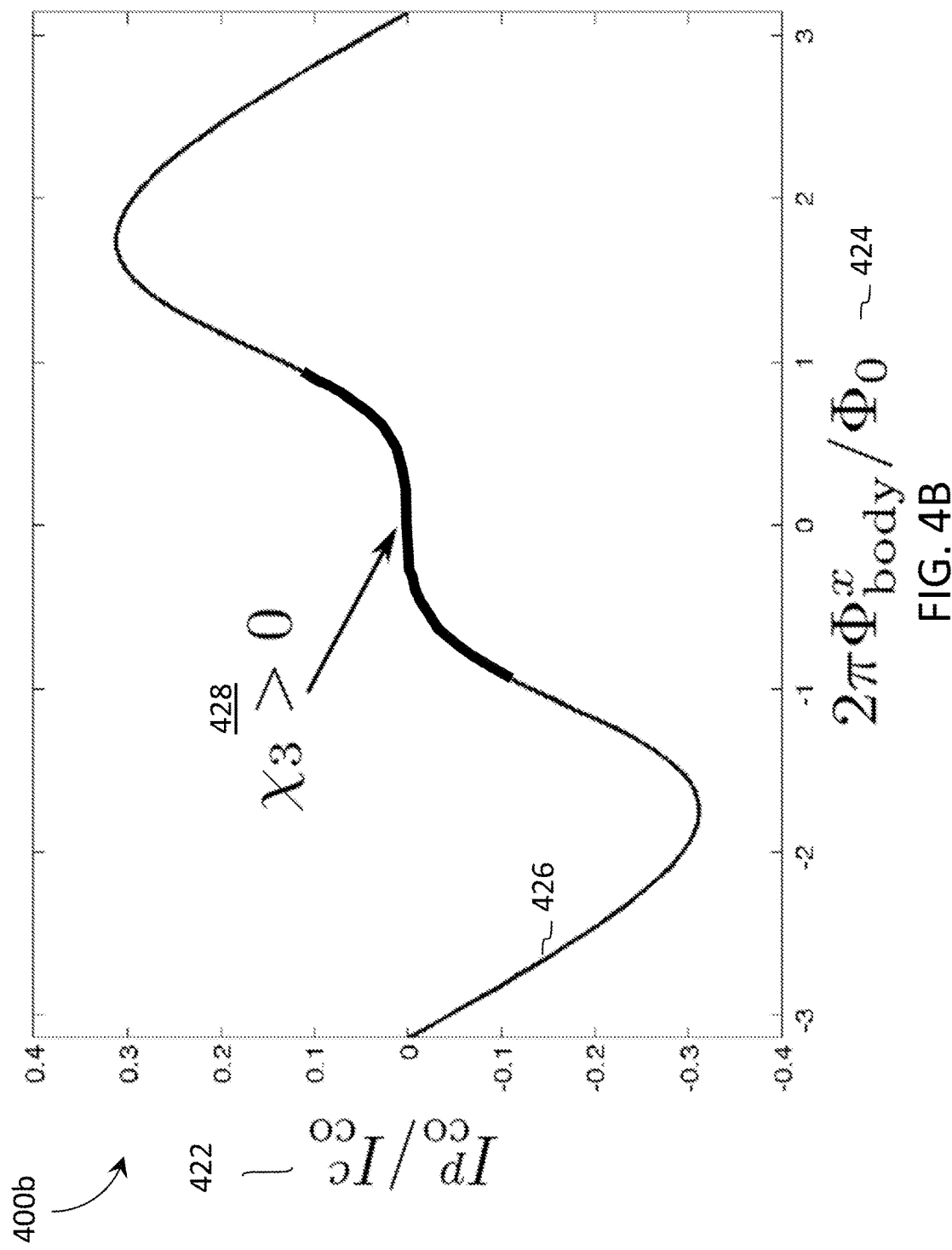
FIG. 4B is a graph that illustrates a calculation of persistent current in the coupler of FIG. 4A versus flux bias applied to a body loop of the coupler when the inductance of the compound Josephson junction of the coupler is comparable to the inductance of the body loop of the coupler, in accordance with the present systems, devices, methods, and articles.

FIG. 4B shows a graph 400b of the calculated response of persistent current $\hat{I}_{co}^p$ within a superconducting coupler to applied flux to the coupler body, $\Phi_{body}^x$, such as within superconducting coupler 402 of FIG. 4A when the inductance of the compound Josephson junction is comparable to the inductance of the body loop.

The graph 400b shows how the coupler behaves in certain regimes. In the graph 400b, the persistent current is plotted against applied external flux. The persistent current is measured in relation the coupler's critical current on vertical axis 422 and the applied flux on the horizontal axis 424. The horizontal axis has been scaled by a factor of $2\pi$. The curve 426 shows the response of the coupler. In regime, 428, where the applied flux is about zero, the response is characterized by a cubic susceptibility $\chi_3$.

As described above, a susceptibility of order a can generate k-local interactions of order $k \leq (\alpha+1)$ among qubits. For example, $\chi_2$ alone can generate 1-local biases and a 3-local interaction. Similarly, $\chi_3$ alone can generate 2-local interactions and a 4-local interaction.

As illustrated in FIG. 4B, the persistent current $\hat{I}_{co}^p$ is antisymmetric about the point at which the applied flux to the coupler body, $\Phi_{body}^x=0$. The antisymmetry of the persistent current results in odd-order interactions $\chi_i$ about $\Phi_{body}^x=0$. Non-zero values of, $\Phi_{body}^x$ are needed to obtain even-order $\chi_i$. More generally, it is possible to obtain a mixture of odd-order and even-order interactions $\chi_i$ by a suitable choice of operating point.

It is desirable to be able to compensate for unwanted interactions. For example, 1-local biases can be nulled, or at least partially compensated, by application of compensating biases on a per-qubit basis. 2-local interactions may be compensated by including first-order susceptibility compensation devices.

Figure 5:
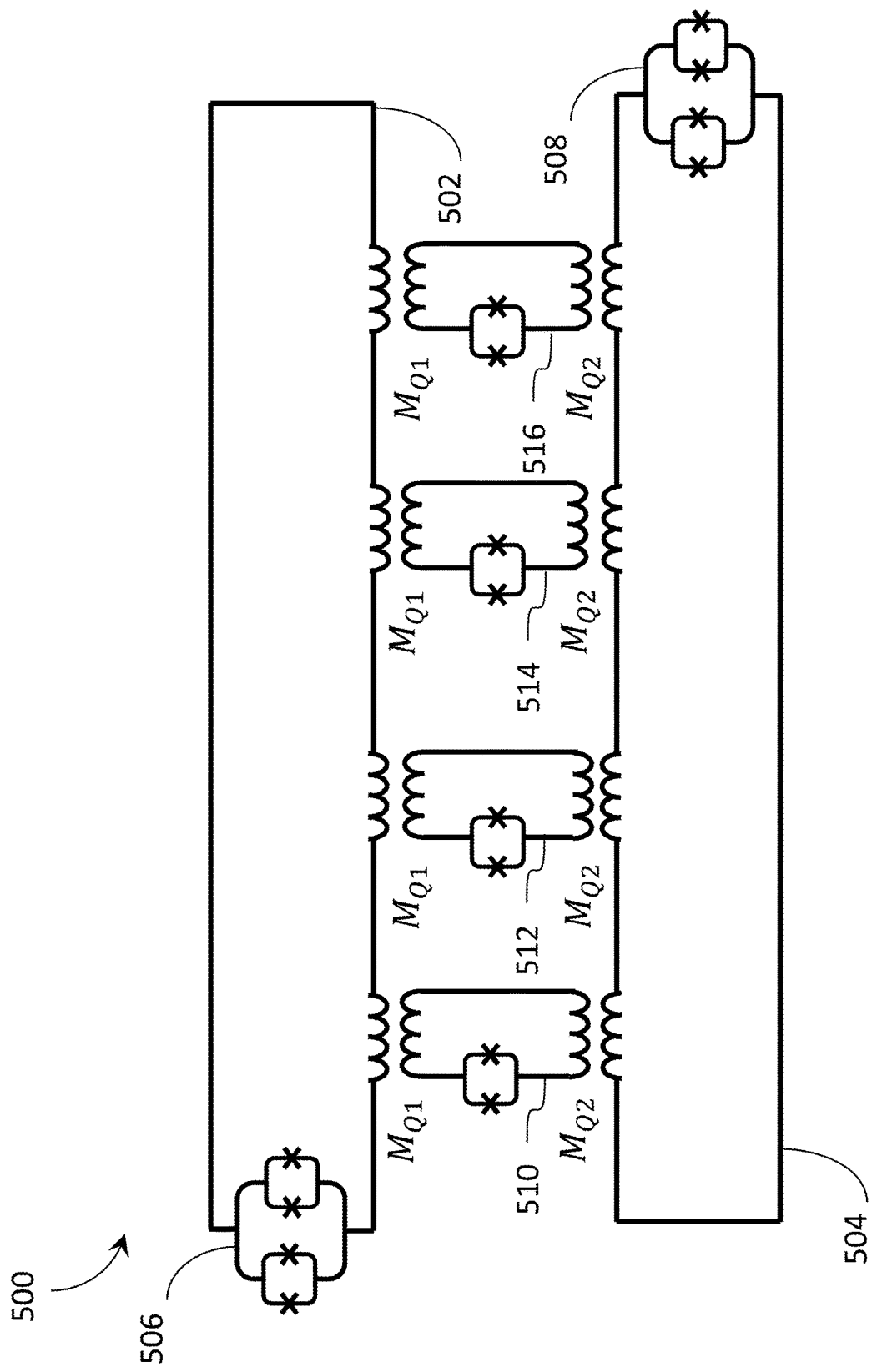
FIG. 5 is a schematic diagram that illustrates a portion of an exemplary superconducting quantum processor including two couplers inductively coupled to four qubits in accordance with the present systems, devices, methods, and articles.

FIG. 5 illustrates a portion of an exemplary superconducting quantum processor 500 including two couplers 502 and 504 inductively coupled to four qubits 510, 512, 514, and 516. The couplers 502 and 504, and qubits 510, 512, 514, and 516, each include a body that forms a loop. The bodies are made from a superconducting material that is superconducting in a range of temperatures, current densities, and magnetic fields. The couplers 502 and 504 each include a compound Josephson junction 506 and 508 respectively, as described in U.S. Pat. No. 8,536,566.

In the example embodiment illustrated in FIG. 5, qubits 510, 512, 514, and 516 are parametrically uniform, and coupled to couplers 502 and 504 with a uniform qubit-coupler mutual inductance $M_{Q1}$ and $M_{Q2}$ respectively, for each of qubits 510, 512, 514, and 516.

One method for compensating for the 2-local interactions is to couple qubits 510, 512, 514, and 516 uniformly to coupler 502, where coupler 502 possesses a purely linear susceptibility. A purpose of coupler 502 is to create the conditions under which qubits 510, 512, 514, and 516 have uniform 2-local interactions between all pairs of qubits taken from qubits 510, 512, 514, and 516. The method provides a practical way to tune the devices independently of one another, so as to optimize, or at least refine, the 4-local interaction, and to null, or at least partially compensate for, the 2-local interactions. An operating point can be selected such that coupler 504 can provide $\chi_3$, and/or coupler 502 can compensate for unwanted 2-local interactions.

More generally, the method described in the context of FIG. 5 provides a way to accomplish multi-qubit interactions in a superconducting quantum processor to a desired precision. For example, multiple couplers can be designed, tuned, and combined, to synthesize a desired response of the superconducting quantum processor, such as providing multi-qubit interactions to a desired precision. For example, applied CJJ flux bias, applied coupler body flux bias, and CJJ inductance can be adjusted to provide multi-qubit interactions in the superconducting quantum processor to a desired precision. The CJJ inductance, for example, can be adjusted by design or can be tuneable.

Figure 6:
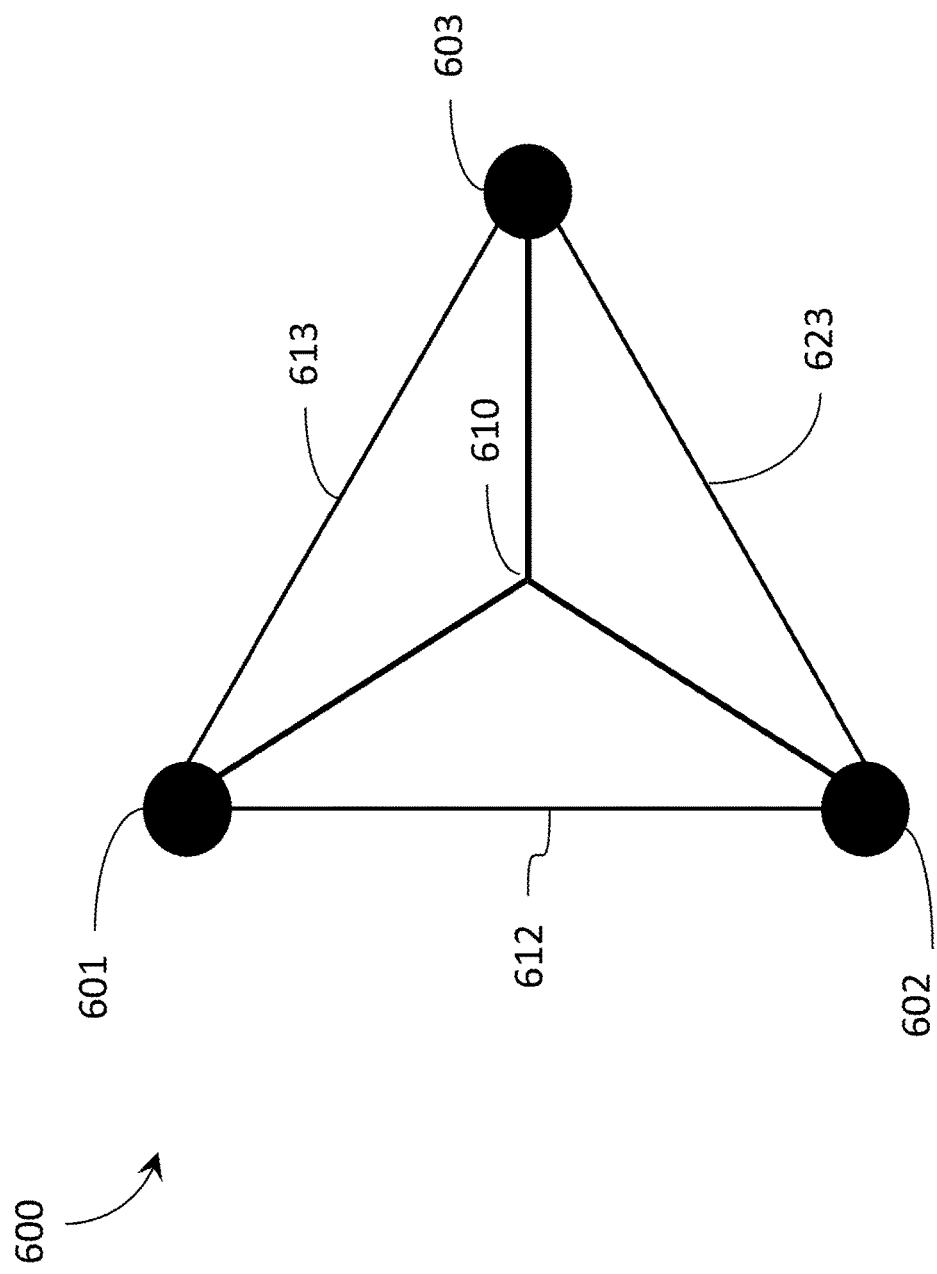
FIG. 6 is a schematic diagram that illustrates a plurality of two-state particles that may tunnel between states and may be coupled in a variety of ways in accordance with the present systems, devices, methods, and articles.

FIG. 6 is a schematic diagram that illustrates a plurality of two-state particles such as 601, 602, and 603, that may tunnel between states and may be coupled in a variety of ways.

Each particle can be subject to single particle operations corresponding to the Pauli matrices $\{I_i, \sigma_i^x, \sigma_i^y, \sigma_i^z\}$ where the subscript is the particle index. In FIG. 6, there are set of 2-local (pairwise) interactions 612, 613, and 623 between the particles 601, 602, and 603. There is also a 3-local interaction 610 among the particles 601, 602, and 603.

With the third-order interaction Hamiltonian implemented on a quantum processor it is possible to create reversible logic gates. These will be described in relation to the system shown in FIG. 6. Two of the particles 601, 602, and 603 can be inputs. One of the particles can be an output. The particles 601, 602, and 603 will be mapped to qubits and variables in the problem of interest. The 2-local (pairwise) interactions 612, 613, and 623; and the 3-local interaction 610 will be mapped to couplers and interaction in the problem of interest.

The 2-local diagonal couplings 612, 613, and 623, and the 3-local interaction 610, can be independently varied. A table of interaction energies for the eight classical spin states of this system is given in Table 1.

TABLE 1

| Bit 1 | Bit 2 | Bit 3 | $E_{123}/J_{123}$ | $E_{12}/J_{12}$ | $E_{23}/J_{23}$ | $E_{13}/J_{13}$ |
|---|---|---|---|---|---|---|
| −1 | −1 | −1 | −1 | 1 | 1 | 1 |
| −1 | −1 | 1 | 1 | 1 | −1 | −1 |
| −1 | 1 | −1 | 1 | −1 | −1 | 1 |
| −1 | 1 | 1 | −1 | −1 | 1 | −1 |
| 1 | −1 | −1 | 1 | −1 | 1 | −1 |
| 1 | −1 | 1 | −1 | −1 | −1 | 1 |
| 1 | 1 | −1 | −1 | 1 | −1 | −1 |
| 1 | 1 | 1 | 1 | 1 | 1 | 1 |

The energy of any given particle configuration can be written as:

$$E = \sum_i E_i + \sum_{j>i}\sum_i E_{ij} + \sum_{k>j}\sum_{j>i}\sum_i E_{ijk}$$

where the 1-local energy $E_i$ can be generated using a local field such as $\varepsilon_i$ in Equation (13).

Figure 7:
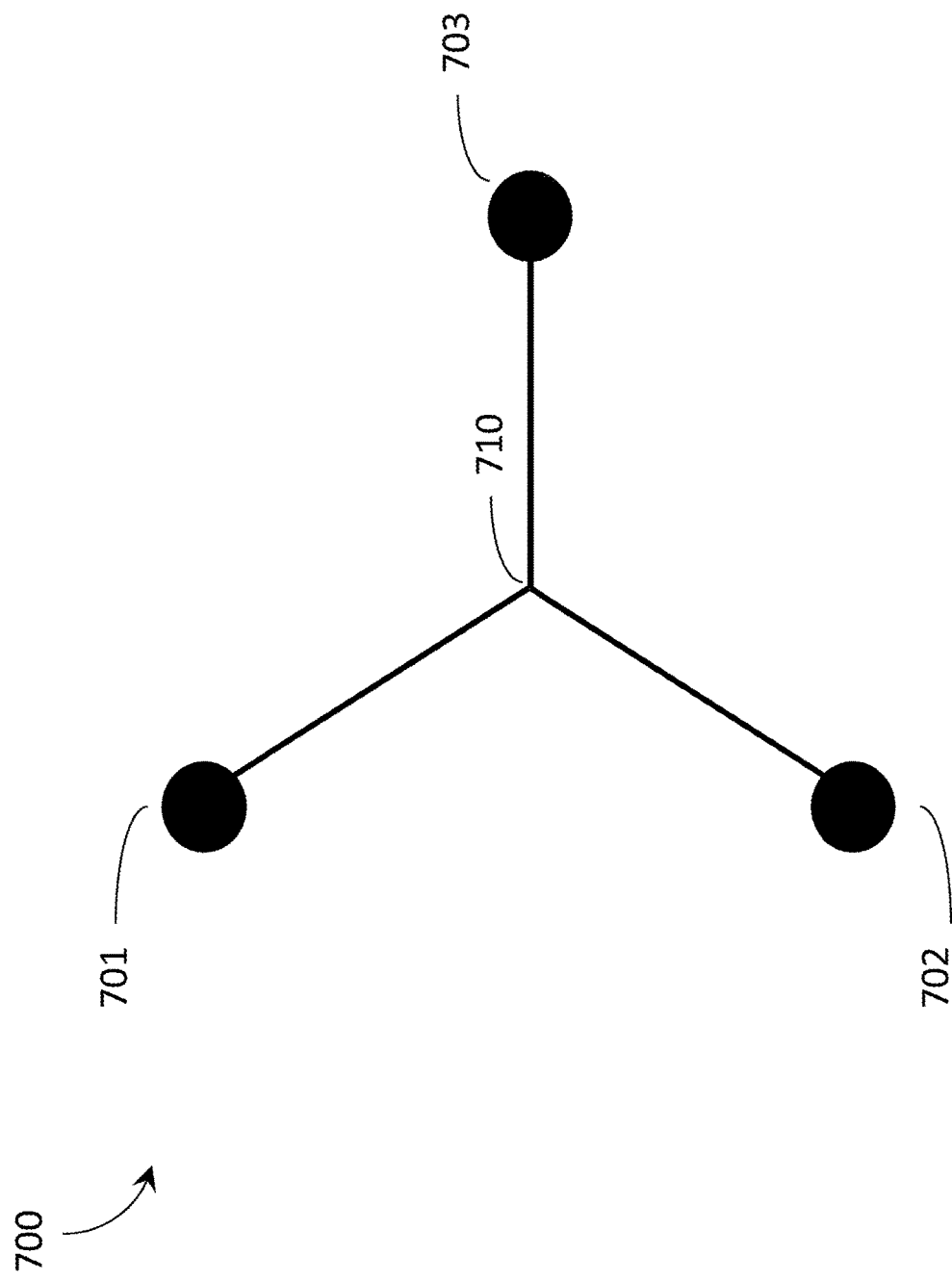
FIG. 7 is a schematic diagram that illustrates a plurality of two-state particles coupled to implement a reversible XOR gate in accordance with the present systems, devices, methods, and articles.

FIG. 7 illustrates a plurality of two-state particles 700 coupled to implement a reversible XOR (exclusive or) gate. Here the qubits 701 and 702 are inputs, and qubit 703 is an output. The absolute value of the 3-local interaction 710 is greater than zero, i.e., $|J_{123}|>0$. The local fields and 2-local interactions are set to zero, or at least their absolute values are set to be much smaller than the absolute value of the 3-local interaction, i.e., the absolute value of the local fields and 2-local interactions are at least one order of magnitude smaller than the absolute value of the 3-local interaction. A set of energies for this system is given in Table 2.

TABLE 2

| Bit 1 | Bit 2 | Bit 3 | $E/J_{123}$ |
|---|---|---|---|
| −1 | −1 | −1 | −1 |
| −1 | −1 | 1 | 1 |
| −1 | 1 | −1 | 1 |
| −1 | 1 | 1 | −1 |
| 1 | −1 | −1 | 1 |
| 1 | −1 | 1 | −1 |
| 1 | 1 | −1 | −1 |
| 1 | 1 | 1 | 1 |

The ground states with energy $E/J_{123}=-1$ correspond to the canonical truth table for XOR. States that do not belong to the XOR truth table possess energy $E/J_{123}=1$ and are mapped onto excited states.

Figure 8:
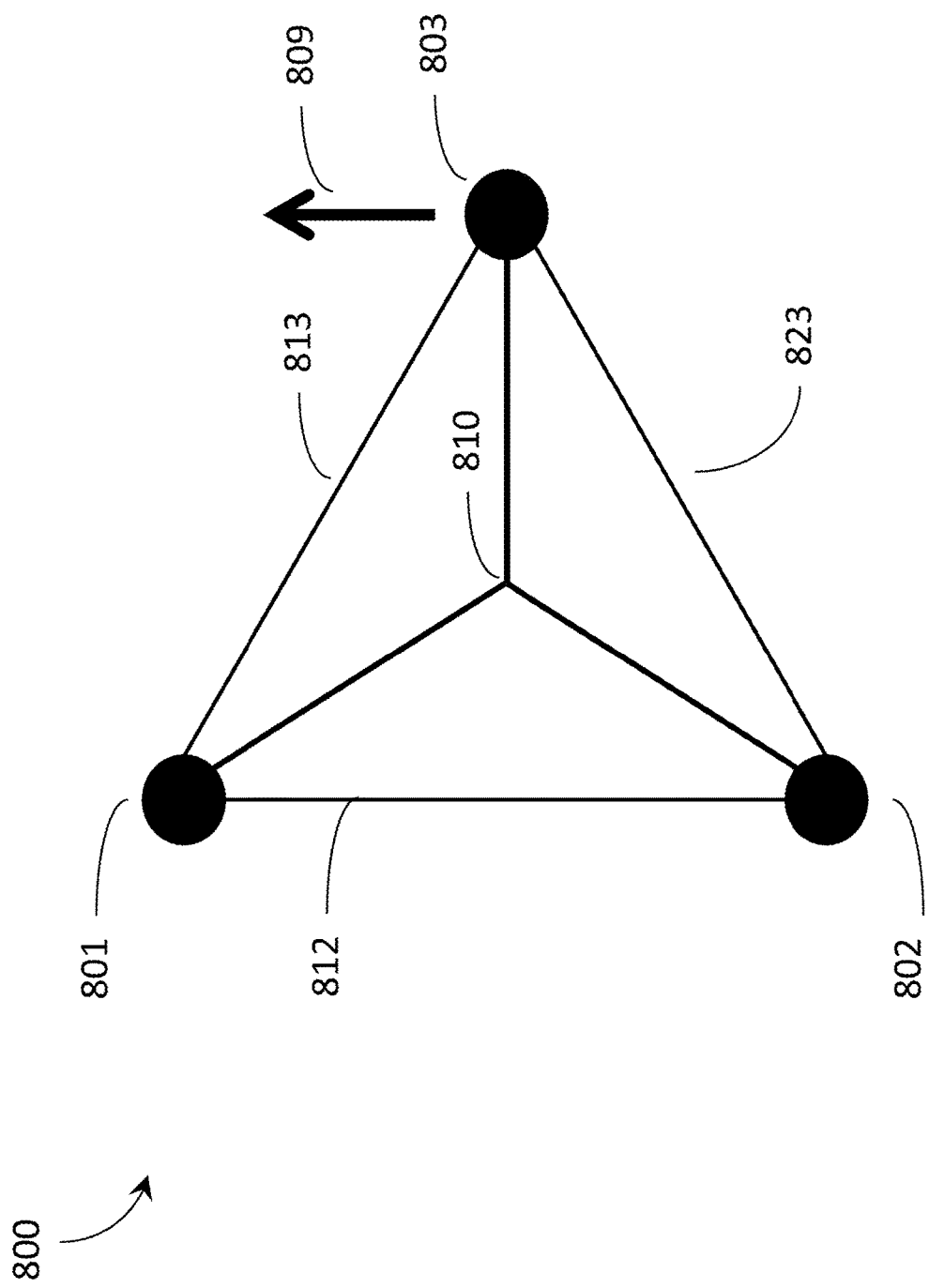
FIG. 8 is a schematic diagram that illustrates a plurality of two-state particles coupled to implement a NAND gate in accordance with the present systems, devices, methods, and articles.

FIG. 8 illustrates a plurality of two-state particles coupled to implement a NAND gate. Here the qubits 801 and 802 are inputs, and qubit 803 is an output. A local bias 809 is applied to the output qubit 803. The strength of this local field is chosen such that:

$$|E_i|=J_{123}>0$$

for qubit 803, or an absolute value of a local bias on qubit 803 is at least approximately the same as an absolute value of the 3-local interaction i.e., an absolute difference between the third-order interaction among the three qubits and the local bias on qubit 803 is smaller than the absolute value of the third-order interaction among the three qubits by at least one order of magnitude.

The strength of the local field for each of qubits 801 and 802 is set to zero, or at least the respective absolute value of each of qubits 801 and 802 is approximately zero, i.e., the respective absolute value of the local bias on each of qubits 801 and 802 is smaller than the absolute value of the third-order interaction among the three qubits by at least one order of magnitude.

Two-local interactions 813 and 823 possess strength:

$$J_{ij}=-J_{123}<0$$

or at least an absolute value of the strength of two-local interactions 813 and 823 is approximately the same as the absolute value of 3-local interaction 810, i.e. an absolute difference between 3-local interaction 810 and the strength of each of two-local interactions 813 and 823 is smaller than 3-local interaction 810 by at least one order of magnitude.

The absolute value of 3-local interaction 810 is non-zero. 3-local interaction 810 can be greater than zero.

The strength of two-local interaction 812 is approximately zero, i.e. an absolute difference between 3-local interaction 810 and two-local interaction 812 is smaller than the absolute value of 3-local interaction 810 by at least one order of magnitude.

References herein and in the claims to any of the local biases, 2-local interactions, and/or 3-local interactions, typically refer to a respective strength of the respective local biases, 2-local interactions, and/or 3-local interactions.

A table of energies to implement the NAND gate is given in Table 3.

TABLE 3

| Bit 1 | Bit 2 | Bit 3 | $E/J_{123}$ |
|---|---|---|---|
| −1 | −1 | −1 | 2 |
| −1 | −1 | 1 | −2 |
| −1 | 1 | −1 | 2 |
| −1 | 1 | 1 | −2 |
| 1 | −1 | −1 | 2 |
| 1 | −1 | 1 | −2 |
| 1 | 1 | −1 | −2 |
| 1 | 1 | 1 | 2 |

The ground states with energy E=−2 of such a system correspond to the canonical truth table for a not and (NAND) logic operation.

The systems and methods described herein can provide third-order (3-local) and higher-order interactions, for example, for reversible logic gates. A benefit of quantum hardware, in accordance with the systems and methods described herein, that natively realizes third-order and higher-order interactions can be realization of higher tunneling energies than quantum hardware that has access to only second-order (pairwise) qubit interactions.

One overall benefit of quantum hardware, in accordance with the systems and methods described herein, can be improved performance and easier access to a harder class of spin glass problems, for example.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other analog processors, not necessarily the exemplary quantum processors generally described above.

For example, though the example embodiments illustrated in FIGS. 3A, 3B, 4A, 4B and 5 relate to configurations of three and four qubits, and either one or two couplers, it should be understood that other numbers and configurations of qubits and couplers can be used.

The various embodiments described above can be combined to provide further embodiments. To the extent that they are not inconsistent with the specific teachings and definitions herein, all of the US patents, US patent application publications, US patent applications, referred to in this specification and/or listed in the Application Data Sheet and which are commonly owned by D-Wave Systems, Inc., including but not limited to U.S. provisional patent application Ser. No. 62/204,820, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A quantum device comprising:
a first qubit;
a second qubit;
a third qubit; and
a first coupler inductively coupled to each of the first, the second, and the third qubits by a respective mutual inductance,
wherein the first coupler provides a third-order interaction or a higher-order interaction among the first, the second, and the third qubits.

2. The quantum device of claim 1 wherein the first coupler is inductively coupled to each of the first, the second, and the third qubits by a respective mutual inductance, directly, and without an intervening coupler.

3. The quantum device of claim 1 wherein the first coupler is the only coupler that is inductively coupleable to each of the first, the second, and the third qubits.

4. The quantum device of claim 1 wherein the coupler comprises a closed loop of material that superconducts at or below a critical temperature, the closed loop of material interrupted by a compound Josephson junction, and further comprises a first, a second, and a third interface structure spaced along the closed loop of material, a respective one of the inductive interface structures for each of the first, the second, and the third qubits.

5. The quantum device of claim 4 wherein the first, the second, and the third interface structures of the first coupler are positioned and operable to selectively inductively couple with respective ones of the first, the second, and the third qubits.

6. The quantum device of claim 5, further comprising:
at least a fourth qubit; and wherein
the closed loop of material of the first coupler has at least a fourth inductive interface structure positioned and operable to selectively inductively couple with the fourth qubit, and the first coupler is operable to provide a third-order interaction or a higher-order interaction among the first, the second, the third and the fourth qubits.

7. The quantum device of claim 6, wherein the first coupler is the only coupler that is directly inductively coupleable to the first, the second, the third, and the fourth qubits.

8. The quantum device of claim 6, wherein the first coupler is operable to provide a third-order magnetic susceptibility among the first, the second, the third, and the fourth qubits, the quantum device further comprising:
a second coupler inductively coupled to each of the first, the second, the third, and the fourth qubits by a respective mutual inductance operable to provide a linear magnetic susceptibility among the first, the second, the third, and the fourth qubits,
wherein the first coupler is tunable to at least one of optimize or enhance a strength of a 4-local interaction among the first, the second, the third, and the fourth qubits, and the second coupler is tunable to null, or at least partially compensate, for a strength of a number of 2-local interactions between pairs of the first, the second, the third, and the fourth qubits.

9. The quantum device of claim 8, wherein the second coupler comprises a closed loop of material that superconducts at or below a critical temperature, the closed loop of the second coupler interrupted by a compound Josephson junction, the closed loop of the second coupler having a first inductive interface structure, a second inductive interface structure, a third inductive interface structure, and a fourth inductive interface structure, the first, the second, the third, and the fourth inductive interface structures positioned and operable to selectively inductively couple with respective ones of the first, the second, the third qubit, and the fourth qubits.

10. The quantum device of claim 1, wherein:
the first qubit has a state, the state of the first qubit representative of a first input to the quantum device;
the second qubit has a state, the state of the second qubit representative of a second input to the quantum device;
the third qubit has a state, the state of the third qubit representative of an output from the quantum device; and
the first coupler is further operable to provide a second-order interaction between each pair of qubits selected from the first, the second and the third qubits.

11. The quantum device of claim 10, wherein the quantum device is a quantum processor.

12. The quantum device of claim 10, wherein the quantum device is a reversible logic gate.

13. The quantum device of claim 12, wherein the reversible logic gate is a reversible exclusive OR (XOR) logic gate, and wherein:
an absolute value of a strength of a third-order interaction among the three qubits is non-zero;
an absolute value of a strength of a second-order interaction between each pair of qubits selected from the three qubits is smaller than the absolute value of the strength of the third-order interaction among the three qubits by at least one order of magnitude; and
a number of absolute values of local bias on each of the three qubits is smaller than the absolute value of the strength of the third-order interaction among the three qubits by at least one order of magnitude.

14. The quantum device of claim 12, wherein the reversible logic gate is a reversible NOT AND (NAND) logic gate, and wherein:
an absolute value of a strength of a third-order interaction among the three qubits is non-zero;
an absolute difference between the strength of the third-order interaction among the three qubits and a strength of a second-order interaction between the first qubit and the third qubit is smaller than the absolute value of the strength of the third-order interaction among the three qubits by at least one order of magnitude;
an absolute difference between the strength of the third-order interaction among the three qubits and the strength of a second-order interaction between the second qubit and the third qubit is smaller than the absolute value of the strength of the third-order interaction among the three qubits by at least one order of magnitude;
an absolute value of a strength of a second-order interaction between the first qubit and the second qubit is smaller than the absolute value of the third-order interaction among the three qubits by at least one order of magnitude;
a respective absolute value of a strength of a local bias on each of the first qubit and the second qubit is smaller than the absolute value of the strength of the third-order interaction among the three qubits by at least one order of magnitude; and
an absolute difference between the strength of the third-order interaction among the three qubits and a strength of a local bias on the third qubit is smaller than the absolute value of the strength of the third-order interaction among the three qubits by at least one order of magnitude.

15. The quantum device of claim 1, wherein:
the first qubit communicatively coupled to receive a first input to the quantum device and which represents the first input to the quantum device via a state of the first qubit;
the second qubit communicatively coupled to receive a second input to the quantum device and which represents the second input to the quantum device via a state of the second qubit;
the third qubit communicatively coupled to receive an output from the quantum device and which represents the output from the quantum device via a state of the third qubit;
the first coupler comprising a closed loop of material that superconducts at or below a critical temperature, the closed loop of the first coupler having a first inductive interface structure, a second inductive interface structure and a third inductive interface structure, the first, the second, and the third inductive interface structures positioned and operable to selectively inductively couple with respective ones of the first, the second and the third qubits, the first coupler further comprising a compound Josephson junction that interrupts the closed loop, the first coupler further operable to provide a second-order interaction between each pair of qubits selected from the first, the second and the third qubits.

16. The quantum device of claim 15, wherein the quantum device is a quantum processor.

17. The quantum device of claim 15, wherein the quantum device is a reversible logic gate.

18. The quantum device of claim 17, wherein the reversible logic gate is a reversible exclusive OR (XOR) logic gate, and wherein
an absolute value of a strength of a third-order interaction among the three qubits is non-zero;
an absolute value of a strength of a second-order interaction between each pair of qubits selected from the three qubits is smaller than the absolute value of the strength of the third-order interaction among the three qubits by at least one order of magnitude; and
a number of absolute values of local bias on each of the three qubits is smaller than the absolute value of the strength of the third-order interaction among the three qubits by at least one order of magnitude.

19. The quantum device of claim 17, wherein the reversible logic gate is a reversible NOT AND (NAND) logic gate, and wherein:
an absolute value of the strength of the third-order interaction among the three qubits is non-zero;
an absolute difference between the strength of the third-order interaction among the three qubits and a strength of a second-order interaction between the first qubit and the third qubit is smaller than the absolute value of the strength the third-order interaction among the three qubits by at least one order of magnitude;
an absolute difference between a strength of the third-order interaction among the three qubits and a strength of a second-order interaction between the second qubit and the third qubit is smaller than the absolute value of the strength of the third-order interaction among the three qubits by at least one order of magnitude;
an absolute value of a strength of a second-order interaction between the first qubit and the second qubit is smaller than the absolute value of the third-order interaction among the three qubits by at least one order of magnitude;
a respective absolute value of a strength of a local bias on each of the first qubit and the second qubit is smaller than the absolute value of the strength of the third-order interaction among the three qubits by at least one order of magnitude; and an absolute difference between the strength of the third-order interaction among the three qubits and a strength of a local bias on the third qubit is smaller than the absolute value of the strength of the third-order interaction among the three qubits by at least one order of magnitude.

20. The quantum device of any of claim 1, wherein at least one qubit is a superconducting qubit.

21. The quantum device of claim 20, wherein the superconducting qubit is a superconducting flux qubit.

22. The quantum device of claim 17, wherein the reversible logic gate is a reversible exclusive OR (XOR) logic gate, and wherein:

a magnitude of the second-order interactions between each pair of qubits selected from the three qubits is essentially zero, and the magnitude of the third-order interaction among the three qubits is greater than zero.

23. The quantum device of claim 17, wherein the reversible logic gate is a reversible NOT AND (NAND) logic gate, and wherein:

a magnitude of the second-order interaction between the first qubit and the third qubit is about the same as the magnitude of the second-order interaction between the second qubit and the third qubit;

a magnitude of the second-order interaction between the second qubit and the third qubit is about the same as the magnitude of the third-order interaction among the three qubits;

a magnitude of the third-order interaction among the three qubits is about the same as a local bias on the third qubit;

the local bias on the third qubit is non-zero;

a magnitude of the second-order interaction between the first qubit and the second qubit is about the same as a local bias on the first qubit;

the local bias on the first qubit is about the same as a local bias on the second qubit; and the local bias on the second qubit is essentially zero.

24. A quantum device comprising:

three or more qubits; and a coupler inductively coupled to each of the three or more qubits by a respective mutual inductance, wherein the coupler at least one of optimizes or enhances at least one of a magnetic susceptibility having an order of at least two so as to provide a greater than pairwise interaction among the three or more qubits, or at least one of a pairwise or a greater than pairwise interaction among one or more subsets of the three or more qubits.

25. The quantum device of claim 24, wherein the coupler comprises a closed loop of material that superconducts at or below a critical temperature, the closed loop of the coupler having at least one inductive interface structure, the at least one inductive interface structure positioned and operable to selectively inductively couple with a respective at least one of the three or more qubits.

26. The quantum device of 24, wherein at least one of the three or more qubits is a superconducting qubit.

27. The quantum device of claim 25, wherein the superconducting qubit is a superconducting flux qubit.

\* \* \* \* \*